(12) United States Patent
Iwasaki et al.

(10) Patent No.: US 8,531,103 B2
(45) Date of Patent: Sep. 10, 2013

(54) ORGANIC EL DEVICE HAVING A MULTI-LAYERED COLOR FILTER, METHOD OF MANUFACTURING ORGANIC EL DEVICE, AND ELECTRONIC APPARATUS

(75) Inventors: Masanori Iwasaki, Shiojiri (JP); Takefumi Fukagawa, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/547,719

(22) Filed: Jul. 12, 2012

(65) Prior Publication Data
US 2013/0020934 A1 Jan. 24, 2013

(30) Foreign Application Priority Data
Jul. 22, 2011 (JP) ................................. 2011-160714

(51) Int. Cl.
*H05B 33/14* (2006.01)
*H01J 9/00* (2006.01)

(52) U.S. Cl.
USPC ............. 313/504; 313/489; 313/506; 445/23; 445/24

(58) Field of Classification Search
CPC ....... H05B 33/14; H01J 9/00; G02F 1/33514; H01L 27/322; G02B 6/0026
USPC ............ 313/500–512; 445/24–25; 349/106; 257/98–99; 362/293
See application file for complete search history.

(56) References Cited

U.S. PATENT DOCUMENTS

| | | | |
|---|---|---|---|
| 5,684,552 | A | 11/1997 | Miyamoto et al. |
| 5,734,457 | A | 3/1998 | Mitsui et al. |
| 6,552,488 | B1 | 4/2003 | Roitman et al. |
| 2003/0179327 | A1 | 9/2003 | Nonaka et al. |
| 2005/0062407 | A1 | 3/2005 | Suh et al. |

FOREIGN PATENT DOCUMENTS

| | | |
|---|---|---|
| JP | A-7-181472 | 7/1995 |
| JP | A-8-292428 | 5/1996 |
| JP | A-8-320480 | 12/1996 |
| JP | A-9-179110 | 7/1997 |
| JP | A-2001-33618 | 2/2001 |
| JP | A-2001-126864 | 5/2001 |
| JP | A-2001-305524 | 10/2001 |
| JP | A-2001-324710 | 11/2001 |
| JP | A-2003-255325 | 9/2003 |
| JP | A-2003-329825 | 11/2003 |
| JP | A-2004-45726 | 2/2004 |
| JP | A-2005-189402 | 7/2005 |
| JP | A-2007-265871 | 10/2007 |
| JP | A-2009-76475 | 4/2009 |
| WO | WO 01/88605 A2 | 11/2001 |

*Primary Examiner* — Tracie Y Green
(74) *Attorney, Agent, or Firm* — Oliff & Berridge, PLC.

(57) ABSTRACT

An organic EL device includes a substrate; a color filter layer that is formed above the substrate; a first electrode that is formed between the substrate and the color filter layer; a second electrode that is formed to face the first electrode; and an organic light-emitting layer that is formed between the first and second electrodes. The color filter layer includes first and second sub-filter layers that are formed in a region overlapping the first electrode, when viewed from a direction perpendicular to the substrate, and transmit a first color. The first and second sub-filter layers are formed of the same material and the first and second sub-filter layers are laminated.

11 Claims, 13 Drawing Sheets

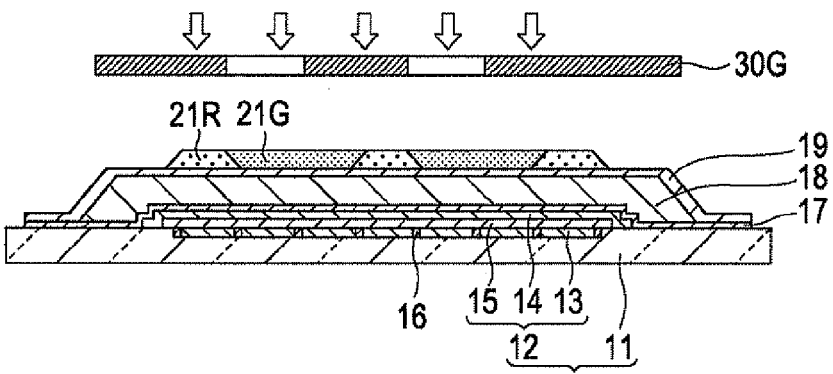
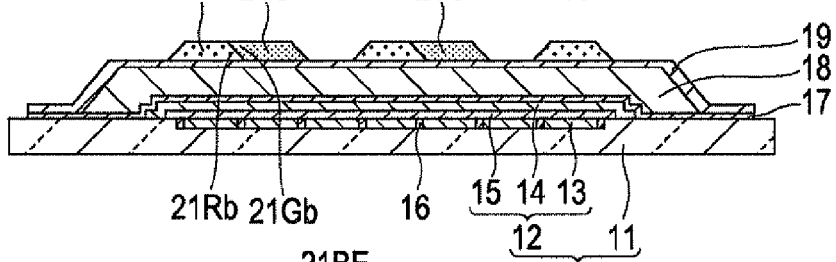
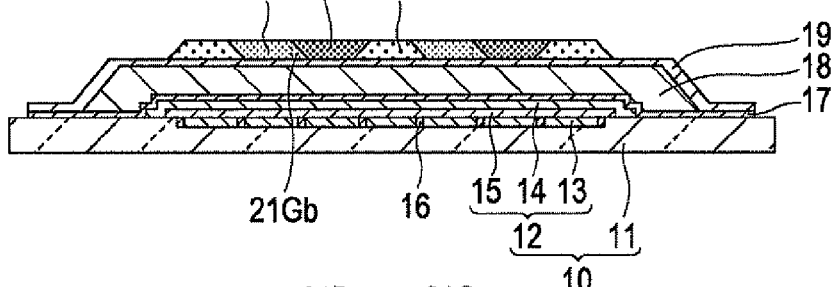
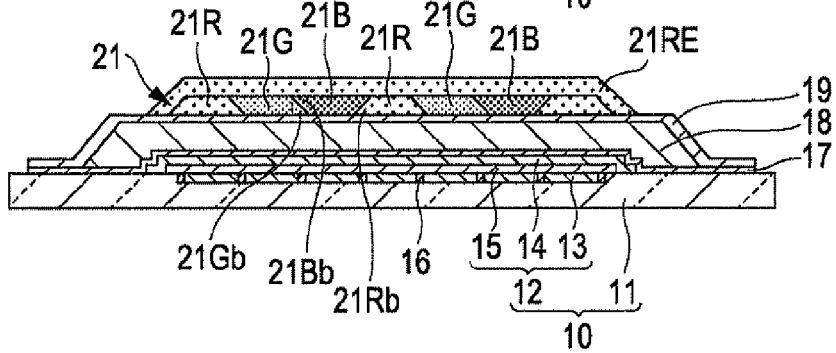
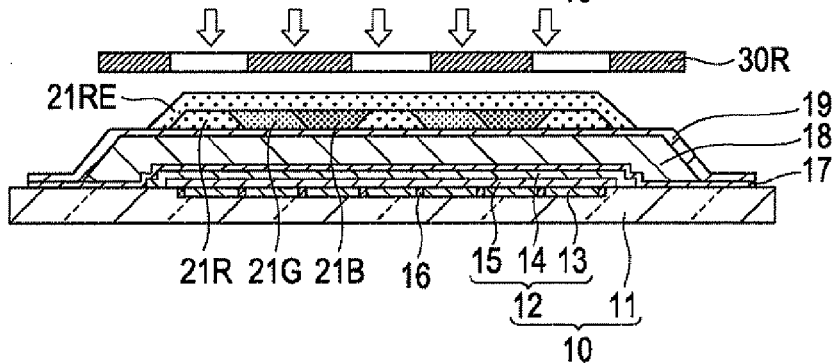

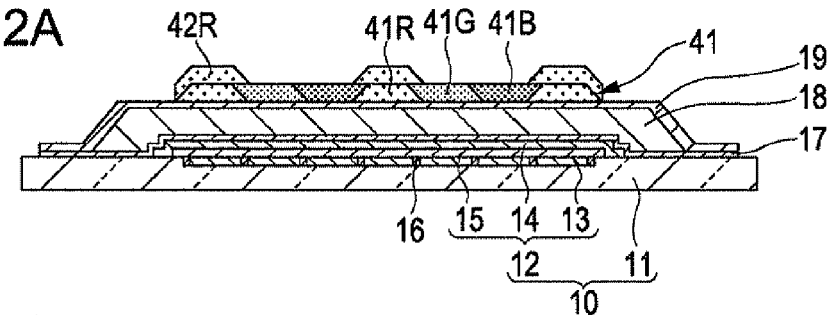
FIG. 12A
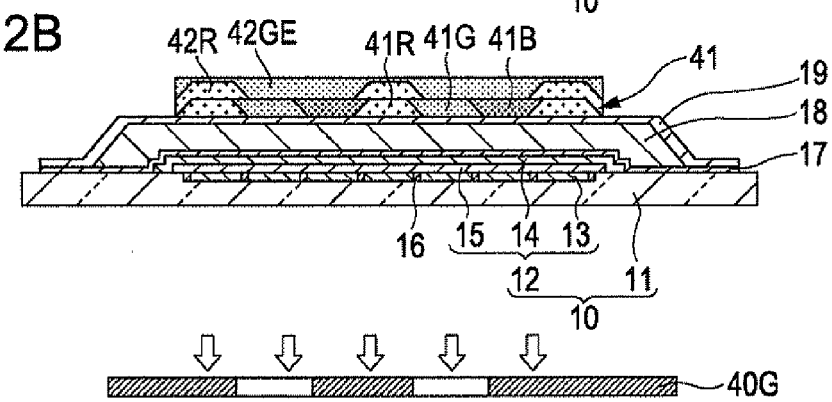
FIG. 12B
FIG. 12C
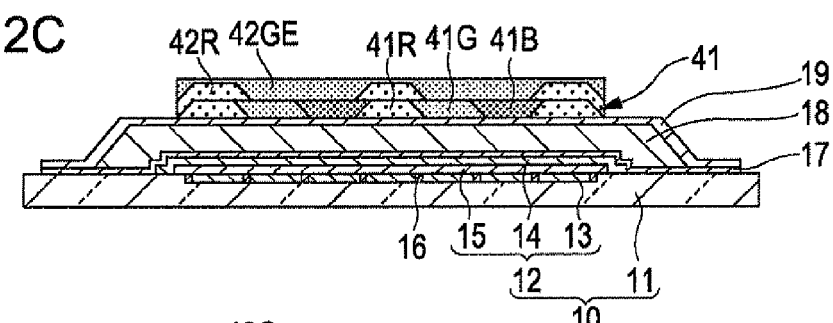
FIG. 12D
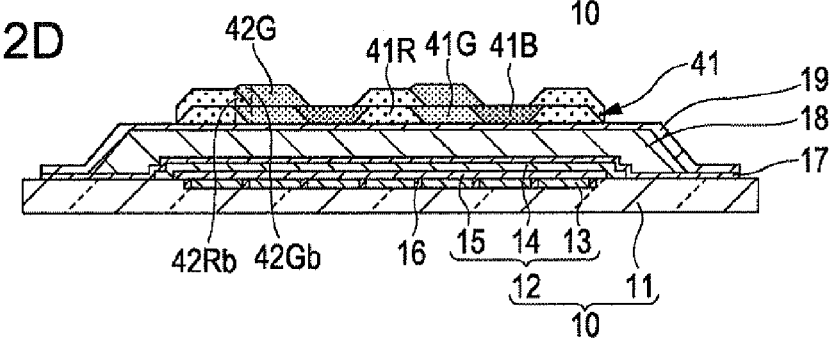
FIG. 12E
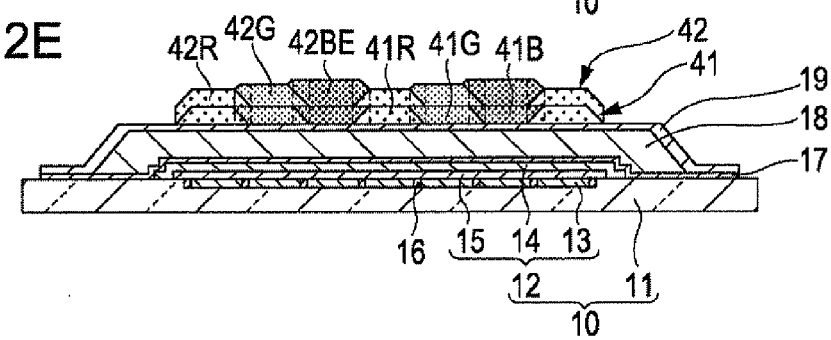

ORGANIC EL DEVICE HAVING A MULTI-LAYERED COLOR FILTER, METHOD OF MANUFACTURING ORGANIC EL DEVICE, AND ELECTRONIC APPARATUS

BACKGROUND

1. Technical Field

The present invention relates to an organic EL device, a method of manufacturing the organic EL device, and an electronic apparatus.

2. Related Art

In recent years, demand for flat display devices consuming low power and having a light weight has increased, as information apparatuses have been diversified. An organic electroluminescence device (organic EL device) including an organic electro-luminescence element (organic EL element) is known as one of the flat display devices. The organic EL device has a configuration in which an organic light-emitting layer is formed between a pixel electrode and a counter electrode.

On the other hand, to make the organic EL device thin, there is a technology of forming a color filter layer on an element substrate in which an organic EL element is formed. For example, in a method of manufacturing an organic EL device disclosed in JP-A-2001-126864, a transparent protection layer is formed on a side on which an organic EL element of an element substrate is formed and a color filter layer is formed on the transparent protection layer using a photolithographic method.

However, when the color filter layer is formed using the photolithographic method, the phenomenon in which a material used to form the color filter layer is formed in a tapered shape (forward tapered shape) in an end portion of the color filter layer may occur. A formation region of the tapered shape may increase as the film thickness of the color filter layer is thickened.

When high-definition of the organic EL device is achieved in a portion of the color filter layer in which a predetermined thickness is ensured in order to color light emitted from the organic EL element and the value of a pixel pitch is close to the value of the film thickness of the color filter layer, the ratio of the formation region of the tapered shape per unit pixel increases. For this reason, a region where the predetermined thickness is ensured in the color filter layer may be very small. As a result, it is difficult to realize high color reproducibility.

SUMMARY

An advantage of some aspects of the invention is that it provides an organic EL device capable of realizing high color reproducibility, a method of manufacturing the organic EL device, and an electronic apparatus having a high display quality.

According to an aspect of the invention, there is provided an organic EL device including a substrate; a color filter layer that is formed on the substrate; a first electrode that is formed between the substrate and the color filter layer; a second electrode that is formed to face the first electrode; and an organic light-emitting layer that is formed between the first and second electrodes. The color filter layer includes first and second sub-filter layers that are formed in a region overlapping the first electrode, when viewed from a direction perpendicular to the substrate, and transmit a first color. The first and second sub-filter layers are formed of the same material and the first and second sub-filter layers are laminated.

With such a configuration, the color filter layer is formed by laminating the first and second sub-filter layers. Therefore, even when it is necessary for the color filter layer to have a predetermined thickness, the first and second sub-filter layers are laminated to form the color filter layer having the predetermined thickness. Thus, the width of a region where an end of each sub-filter layer is formed in a tapered shape can be made to be less than the width of a region where an end of the single-layered color filter layer is formed in a tapered shape. Therefore, it is possible to broaden the region where the predetermined thickness can be ensured in the color filter layer. Accordingly, the organic EL device capable of realizing high color reproducibility can be obtained. Hereinafter, the end of the sub-filter layer, that is, a region where a tapered shape is formed, is referred to as a tapered portion.

The organic EL device may further include a third electrode that is formed in the same layer of the first electrode to face the second electrode. The color filter layer may further include third and fourth sub-filter layers that are formed in a region overlapping the third electrode, when viewed from the direction perpendicular to the substrate, and transmit a second color. The third and fourth sub-filter layers may be formed of the same material. The third and fourth sub-filter layers may be laminated. An end of the first sub-filter layer and an end of the third sub-filter layer may overlap one another, when viewed from the direction perpendicular to the substrate. An end of the second sub-filter layer and an end of the fourth sub-filter layer may overlap one another, when viewed from the direction perpendicular to the substrate.

With such a configuration, a tapered portion of the first sub-filter layer is disposed to overlap a tapered portion of the third sub-filter layer in a plan view. Further, a tapered portion of the second sub-filter layer is disposed to overlap a tapered portion of the fourth sub-filter layer in a plan view. Therefore, the region where the predetermined thickness can be ensured in the color filter layer can be realized in a broad range.

In the organic EL device, a flattened layer may be formed between the first and second sub-filter layers.

With such a configuration, a region where the second sub-filter layer is formed is flattened by the flattened layer, even when the upper surface of the first sub-filter layer formed on the substrate has an uneven shape. Accordingly, it is easy to form the second sub-filter layer.

The organic EL device may further include a flattened layer that is formed between the first and second sub-filter layers. A light-shielding layer may be formed in a region of the flattened layer overlapping the first and third sub-filter layers, when viewed from the direction perpendicular to the substrate.

With such a configuration, since light emitted in the organic light-emitting layer is shielded by the light-shielding layer, the light emitted in the organic light-emitting layer is transmitted in the pattern corresponding to the organic light-emitting layer, and thus is not transmitted through a neighboring pattern. Accordingly, it is possible to prevent the emission colors from mixing.

The organic EL device may further include a sealing layer that is formed between the second electrode and the color filter layer. The color filter layer may be adjacent to the sealing layer.

With such a configuration, the organic EL device capable of realizing high color reproducibility can be embodied in a so-called top emission type OCCF (On-chip Color Filter) structure in which the color filter layer is formed on the sealing layer.

According to another aspect of the invention, there is provided a method of manufacturing an organic EL device. The method includes: forming a first electrode on a substrate; forming an organic light-emitting layer on the first electrode; forming a second electrode on the organic light-emitting layer; and forming a color filter layer on the second electrode in a region overlapping the first electrode, when viewed from a direction perpendicular to the substrate. The forming of the color filter layer includes forming a first sub-filter layer by a photolithographic method, and forming a second sub-filter layer on the first sub-filter layer using the same material of the first sub-filter layer by the photolithographic method.

According to this manufacturing method, the color filter layer is formed by laminating the first and second sub-filter layers using a photolithographic method. Therefore, even when it is necessary for the color filter layer to have the predetermined thickness, the color filter layer having the predetermined thickness can be formed by laminating the first and second sub-filter layers. Thus, the width of the tapered portion of each sub-filter layer can be made to be less than the width of the tapered portion of the single-layered color filter layer. Therefore, it is possible to broaden the region where the predetermined thickness can be ensured in the color filter layer. Accordingly, the organic EL device capable of realizing high color reproducibility can be manufactured.

According to still another aspect of the invention, there is provided an electronic apparatus including the organic EL device.

Since the electronic apparatus according to this aspect of the invention includes the organic EL device according to the above aspect of the invention, the electronic apparatus with high display quality can be provided.

BRIEF DESCRIPTION OF THE DRAWINGS

The invention will be described with reference to the accompanying drawings, wherein like numbers reference like elements.

FIGS. 4A to 4E are diagrams illustrating processes subsequent to the processes shown in FIGS. 3A to 3E.

FIGS. 12A to 12E are diagrams illustrating processes of manufacturing the organic EL device.

DESCRIPTION OF EXEMPLARY EMBODIMENTS

Figure 1:
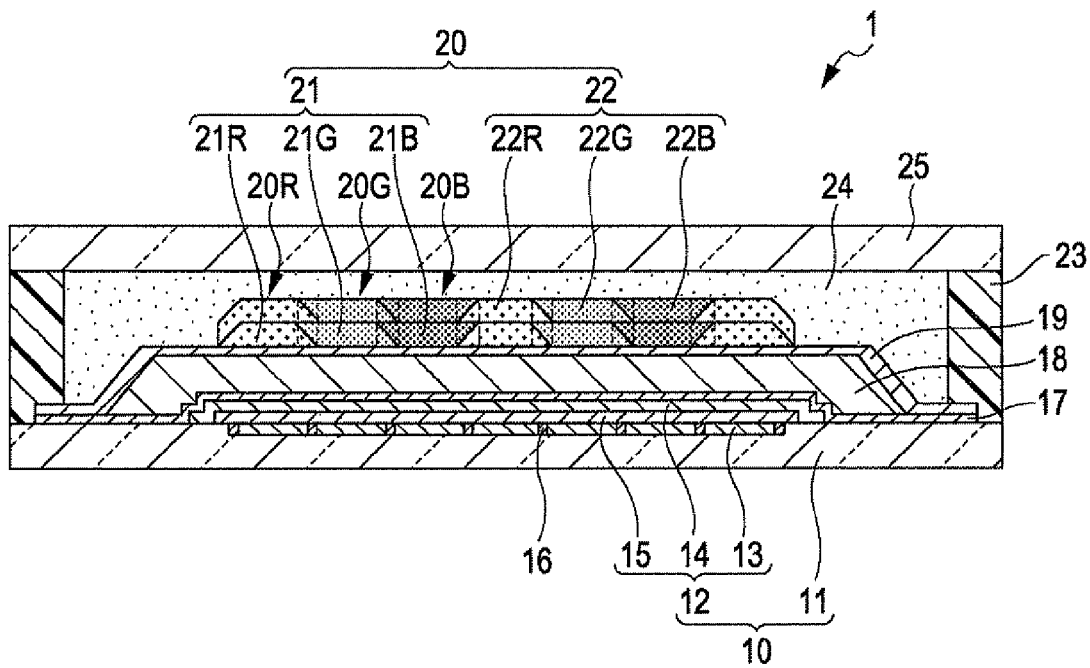
FIG. 1 is a sectional view illustrating an organic EL device according to a first embodiment of the invention.

Hereinafter, embodiments of the invention will be described with reference to the drawings. The embodiments are merely examples of inventions. The invention is not limited thereto, but may be modified within the scope of the technical spirit and essence of the invention. In the drawings described below, to facilitate each configuration, scales or numbers may be different from those of the actual configuration.

First Embodiment

FIG. 1 is a sectional view illustrating an organic EL device 1 according to a first embodiment of the invention.

As shown in FIG. 1, the organic EL device 1 includes various kinds of wirings (not shown) formed on a substrate body, thin film transistors (hereinafter, referred to as TFTs) serving as switching elements, and a TFT array substrate 11 that causes a light-emitting layer (organic light-emitting layer) to emit light using various circuits. Further, the organic EL device 1 according to this embodiment is an active matrix device that uses the TFTs as switching elements, but the invention is not limited thereto. The invention is applicable to a device that has a simple matrix type configuration.

The organic EL device 1 according to this embodiment is an organic EL device that has a so-called "top emission structure." Since light is emitted not from the side of an element substrate 10 but from the side of a counter electrode 14 in the top emission structure, it is possible to obtain an advantage of ensuring a light-emission area without an influence on the sizes of various circuits disposed in the element substrate 10. Accordingly, the luminance can be ensured while suppressing voltage and current, and the lifetime of a light-emitting element (organic EL element) 12 can increase.

The organic EL device 1 includes the element substrate 10, an electrode protection layer (first inorganic sealing layer) 17 formed to cover the entire exposed portion of the light-emitting element 12 on the element substrate 10, an organic buffer layer 18 formed on the electrode protection layer 17, a gas barrier layer (second inorganic sealing layer) 19 formed to cover the entire exposed portion of the organic buffer layer 18 on the electrode protection layer 17, a color filter layer 20 formed on the gas barrier layer 19, a circumference sealing layer 23 formed along the outer circumference of the element substrate 10, a filling layer 24 formed inside the circumference sealing layer 23, and a protection substrate 25 bonded with the element substrate 10 with the circumference sealing layer 23 interposed therebetween.

Instead of the electrode protection layer 17, the organic buffer layer 18, and the gas barrier layer 19 described above, a sealing layer may be formed by an inorganic film that is formed by applying an inorganic material such as polysiloxane or polysiloxane. In the organic EL device 1, the circumference sealing layer 23, the filling layer 24, and the protection substrate 25 are not essential constituent elements. The circumference sealing layer 23, the filling layer 24, and the protection substrate 25 may be not provided.

The element substrate 10 includes the TFT array substrate 11, the plurality of light-emitting elements 12 that interpose the organic light-emitting layer 15 between the pixel electrode 13 and the counter electrode 14, and pixel partition walls 16 that partition the light-emitting elements 12 (pixel electrodes 13).

In this embodiment, the pixel electrode 13 is formed of a material that has a high hole injection effect in which a work function is 5 eV or more. For example, a metal oxide such as ITO (Indium Tin Oxide) is used as the material. In this embodiment, since the top emission type is used, the pixel electrode 13 may not have light permeability. Accordingly, in this embodiment, a light-reflective metal layer, such as Al, is formed in a lower layer of a transparent conductive layer formed of ITO to form a laminate structure. Thus, the pixel electrode 13 is formed by the laminate structure.

In this embodiment, the organic function layer 15 is formed so as to include an organic light-emitting layer formed of a low-molecular organic EL material. As the organic function layer 15, for example, a structure in which a hole injection layer, a hole transport layer, an organic light-emitting layer, an electron transport layer, and an electron injection layer are sequentially laminated is known. Further, a structure that has no hole transport layer or no electron transport layer from the side of the pixel electrode is known. A structure that uses a hole injection and transport layer having both functions of the hole injection layer and the hole transport layer or an electron injection and transport layer having both functions of the electron injection layer and the electron transport layer is known. In the invention, an appropriate structure is selected from these structures.

A known material can be used as the material of the organic function layer 15. For example, a styryl amine-based light emission material which is an organic light emission material for emitting white light is used as the material of the organic light-emitting layer in this embodiment.

Further, triarylamine (ATP) multimeric complex or the like is used as the material of the hole injection layer. TDP (triphenyldiamine)-based material or the like is used as the material of the hole transport layer. Aluminum quinolinol (Alq3) or the like is used as the material of the electron injection and transport layer.

The counter electrode 14 covering the organic function layer 15 is formed on the organic function layer 15. A material having light permeability is necessarily used as the material of the counter electrode 14 in consideration of the top emission structure in this embodiment. A transparent conductive material is used as the material of the counter electrode 14. ITO is suitable for the transparent conductive material. For example, indium zinc oxide amorphous transparent conductive film (IZO (registered trademark)) may also be used. In this embodiment, ITO is used as the material of the counter electrode 14.

A material that has a large electron injection effect (in which a work function is equal to or less than 4 eV) is used as the material of the counter electrode 14. For example, calcium, magnesium, sodium, or lithium metal or a metal compound thereof is used. Examples of the metal compound include metallic fluoride such as calcium fluoride, metal oxide such as lithium oxide, and organometallic complex such as calcium acetylacetonate. Further, it is desirable to reduce the electric resistance by laminating metal oxide conductive layers such as transparent ITO and tin oxide. In this embodiment, a laminate of lithium fluoride, a magnesium-silver alloy, and ITO is assumed to be used by adjusting the film thickness to ensure transparency.

In the organic EL device 1 according to this embodiment, the organic EL element is formed by the pixel electrode 13, the organic function layer 15, and the counter electrode 14. That is, when a voltage is applied between the pixel electrode 13 and the counter electrode 14, holes are injected from the pixel electrode 13 to the hole injection layer and are transported to the organic light-emitting layer via the hole transport layer. Further, electrons are injected from the counter electrode 14 to the electron injection layer and are transported to the organic light-emitting layer via the electron transport layer. Then, the holes and electrons transported to the organic light-emitting layer are recombined, and thus the organic light-emitting layer produces light.

The light emitted from the side of the organic light-emitting layer to the pixel electrode passes through the transparent conductive layer, is reflected from the light-reflective metal layer, and is incident on the side of the organic light-emitting layer again. Further, since the counter electrode 14 functions as a semi-transmissive reflection film, light with a wavelength other than a wavelength of a predetermined range is reflected toward the light-reflective metal layer and reciprocates between the counter electrode 14 and the light-reflective metal layer. Thus, only the light with the resonant wavelength corresponding to the optical distance between the counter electrode 14 and the light-reflective metal layer is amplified and output. That is, since a section including the counter electrode 14 and the light-reflective metal layer functions as a resonator, the light with high light emission luminance and a sharp spectrum can be emitted. Here, the optical distance can be calculated by the sum of the optical distances of the layers included between the counter electrode 14 and the light-reflective metal layer, and the optical distance of each layer can be calculated by a product of the film thickness and refractive index of each layer.

The electrode protection layer 17 protecting the light-emitting element 12 is formed on the TFT array substrate 11.

The electrode protection layer 17 is preferably formed of a silicon compound such as silicon oxynitride in consideration of transparency, adhesiveness, water resistance, and a gas barrier property.

In this embodiment, the electrode protection layer 17 is formed by a single layer, but may be formed by a plurality of layers. For example, the electrode protection layer 17 may be formed by a lower layer with low elasticity and an upper layer of high water resistance.

The organic buffer layer 18 covering a region where the light-emitting element 12 is formed is formed on the electrode protection layer 17.

The organic buffer layer 18 is disposed such that the uneven portion of the electrode protection layer 17 formed in an uneven shape is buried by the influence of the shapes of the pixel partition walls 16. The upper surface of the organic buffer layer 18 is formed to be substantially flat. The organic buffer layer 18 has a function of alleviating the stress caused due to the curved state or the volume expansion of the TFT array substrate 11. Since the upper surface of the organic buffer layer 18 is substantially flat, a gas barrier layer 19, which is described later, formed of a hard coated layer formed on the organic buffer layer 18 is also flattened. Accordingly, the portion on which the stress is focused is not formed, and thus cracks in the gas barrier layer 19 are prevented from occurring. Further, since the pixel partition walls 16 are coated and the unevenness is buried, it is also effective to improve uniformity of the film thickness of the color filter layer 20 formed on the gas barrier layer 19.

Since the organic buffer layer 18 is necessarily formed of, as a material main component before curing, an organic compound material which has excellent fluidity and has no solvent or volatile component so as to be formed by a screen printing method under a decompression vacuum environment, the entirety thereof has to be an organic compound material which is a material of polymer backbone. An epoxy monomer/oligomer having an epoxy group and a molecular mass of 3000 or less is preferably used (definition of the monomer: molecular mass of 1000 or less, definition of oligomer: molecular mass of 1000 to 3000). Examples of the epoxy monomer/oligomer include bisphenol A-type epoxy oligomer, bisphenol F-type epoxy oligomer, phenol novolac-type epoxy oligomer, polyethylene glycol diglycidyl ether, alkyl glycidyl ether, 3,4-epoxycyclohexylmethyl-3',4'-epoxycyclohexane carboxylate, ε-caprolactone modified 3,4-epoxycylohexylmethyl, and 3',4'-epoxycyclohexane carboxylate, and one or a combination of a plurality thereof is used.

As a curing agent reacting with epoxy monomer/oligomer, an agent of forming a cured coated film having excellent electric insulation property or adhesiveness and having excellent heat resistance thanks to high and strong hardness may be used and an addition polymer type agent having excellent transparency and small curing variation may be used. For example, an acid anhydride-based curing agent such as 3-methyl-1,2,3,6-tetrahydrophthalic acid anhydride, methyl-3,6-endomethylen-1,2,3,6-tetrahydrophthalic acid anhydride, 1,2,4,5-benzenetetracarboxylic dianhydride, or 3,3'4,4'-benzenephenonetetracarboxylic dianhydride is preferable. Further, when alcohols having a large molecular mass and rarely volatilized, such as 1,6-hexanediol are added as a reaction accelerant accelerating reaction (ring-opening) of acid anhydride, it is easy to perform the curing at a low temperature. The curing is performed through heating in the range of 60° C. to 100° C., and the cured coated film becomes a polymer having an ester bond. Further, when a small amount of an amine compound such as aromatic amine, alcohols, or aminophenol is added as a curing accelerant accelerating ring-opening of acid anhydride, it is easy to perform the curing at a low temperature.

The gas barrier layer 19 coating the organic buffer layer 18 is formed on the organic buffer layer 18 in a broad range covering up to the end portion of the electrode protection layer 17.

The gas barrier layer 19 is a layer that prevents oxygen or moisture from infiltrating. Thus, the gas barrier layer can suppress deterioration or the like in the light-emitting element 12 due to oxygen or moisture. The gas barrier layer 19 is preferably formed of a silicon compound including nitrogen, that is, silicon nitride, silicon oxynitride, or the like in consideration of transparency, a gas barrier property, and water resistance.

In this embodiment, since the organic EL device 1 has the top emission structure, it is necessary for the gas barrier layer 19 to have light permeability. Accordingly, by appropriately adjusting the material quality or the film thickness of the gas barrier layer 19, the light transmittance in a visible light region is set to, for example, 80% or more in this embodiment.

The color filter layer 20 is formed on the surface of the gas barrier layer 19.

The color filter layer 20 has a configuration in which a red coloring layer 20R, a green coloring layer 20G, and a blue coloring layer 20B are arranged in that order as coloring layers.

Each of the coloring layers 20R, 20G, and 20B is formed of a material in which a colorant or a pigment are mixed in a transparent binder. The width of each of the coloring layers 20R, 20G, and 20B is about 10 μm and each layer is adjusted to have substantially the same width as the pixel electrode 13 of the light-emitting element 12. Each of the coloring layers 20R, 20G, and 20B necessarily has a predetermined thickness to color the light emitted from the light-emitting element 12. For example, the predetermined thickness is about 1 μm. The thicknesses of the coloring layers 20R, 20G, and 20B are adjusted for each color in consideration of the white balance. When the emission color of the light-emitting layer 15 passes through the coloring layers 20R, 20G, and 20B, the coloring layers 20R, 20G, and 20B are configured to emit the light as color lights of red light, green light, and blue light, respectively, toward an observer. Thus, in the organic EL device 1, the coloring layers 20R, 20G, and 20B of the plurality of colors are configured to display colors using the emission color of the light-emitting layer 15.

The color filter layer 20 is formed such that the first sub-filter layer 21 and the second sub-filter layer 22 are laminated.

The first sub-filter layer 21 is arranged such that a red pattern 21R, a green pattern 21G, and a blue pattern 21B are adjacent to each other.

The second sub-filter layer 22 is arranged such that a red pattern 22R, a green pattern 22G, and a blue pattern 22B are adjacent to each other.

In this embodiment, the color filter layer 20 includes two sub-filter layers, but the invention is not limited thereto. The color filter layer 20 may include three or more sub-filter layers.

Figure 2:
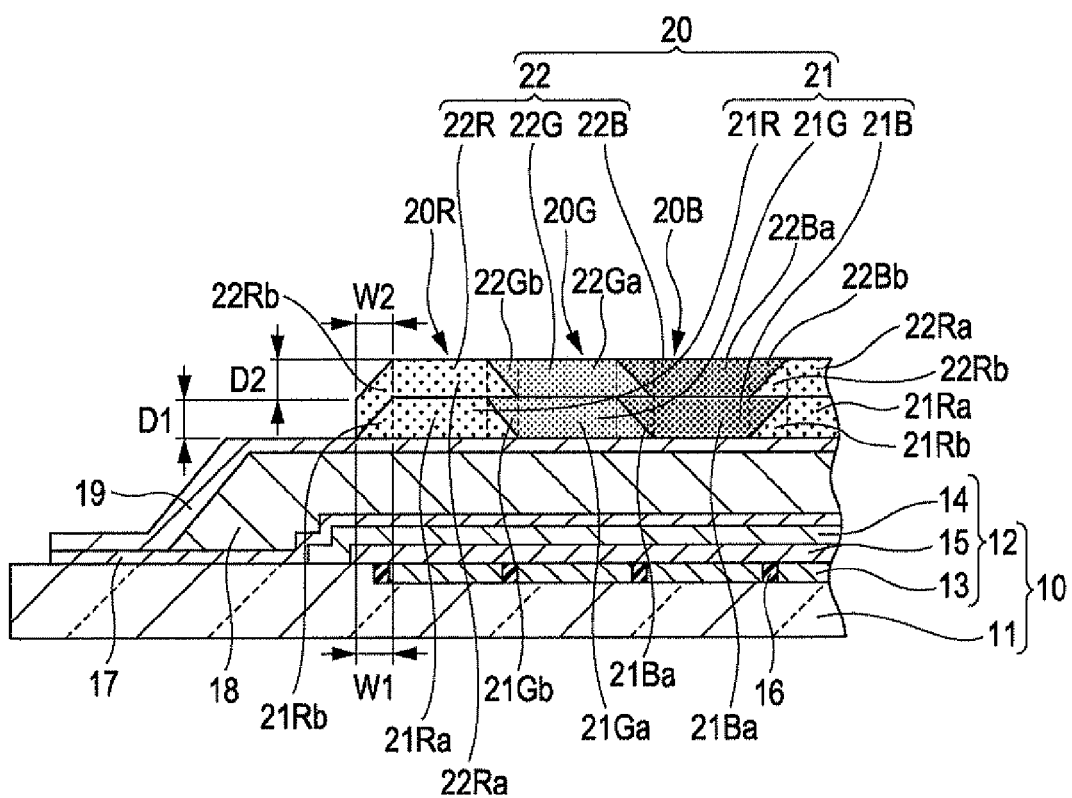
FIG. 2 is a sectional view illustrating main units of the organic EL device.

FIG. 2 is a sectional view illustrating the main constituent elements of the organic EL device 1 according to this embodiment. In FIG. 2, the circumference sealing layer 23, the filling layer 24, and the protection substrate 25 are not illustrated to facilitate the description.

In FIG. 2, D1 denotes the thickness of the first sub-filter layer 21, D2 denotes the thickness of the second sub-filter layer 22, W1 denotes the width of a tapered portion of the first sub-filter layer 21, and W2 denotes the width of a tapered portion of the second sub-filter layer 22.

Here, "the thickness of the sub-filter layer" means the length (the distance between the lower and upper surfaces of the sub-filter layer) of the sub-filter layer in a direction perpendicular to the upper surface of the element substrate 10.

Further, "the width of the tapered portion" means the length (a distance between a surface adjacent to a side end of a main portion of the tapered portion and a portion farthest from the side end of the main portion of the tapered portion) of the tapered portion in the arrangement direction of each color pattern.

In FIG. 2, the width W1 of the tapered portion of the first sub-filter layer 21 is assumed to be the width of, for example, a tapered portion 21Rb of the red pattern 21R among the patterns 21R, 21G, and 21B. Further, the width W1 of the tapered portion of the second sub-filter layer 22 is assumed to be the width of, for example, a tapered portion 22Rb of the red pattern 22R among the patterns 22R, 22G, and 22B.

As shown in FIG. 2, the red pattern 21R of the first sub-filter layer 21 includes a red main portion 21Ra having a substantially uniform thickness and red tapered portions 21Rb adjacent to the side ends of the red main portion 21Ra.

The green pattern 21G includes a green main portion 21Ga having a substantially uniform thickness and green tapered portions 21Gb adjacent to the side ends of the green main portion 21Ga.

The blue pattern 21B includes a blue main portion 21Ba having a substantially uniform thickness and blue tapered portions 21Bb adjacent to the side ends of the blue main portion 21Ba.

In this embodiment, the red tapered portion 21Rb has a forward tapered shape in both a portion overlapping the green tapered portion 21Gb and a portion overlapping the blue tapered portion 21Bb, in a plan view. The green tapered portion 21Gb has a backward tapered shape in a portion overlapping the red tapered portion 21Rb in a plan view and a forward tapered shape in a portion overlapping with the blue tapered portion 21Bb in a plan view. The blue tapered portion 21Bb has a backward tapered shape in both a portion overlapping the green tapered portion 21Gb and a portion overlapping the red tapered portion 21Rb in a plan view.

In the second sub-filter layer 22, the red pattern 22R includes a red main portion 22Ra having a substantially uniform thickness and red tapered portions 22Rb adjacent to the side ends of the red main portion 22Ra.

The green pattern 22G includes a green main portion 22Ga having a substantially uniform thickness and green tapered portions 22Gb adjacent to the side ends of the green main portion 22Ga.

The blue pattern 22B includes a blue main portion 22Ba having a substantially uniform thickness and blue tapered portions 22Bb adjacent to the side ends of the blue main portion 22Ba.

In this embodiment, the red tapered portion 22Rb has a forward tapered shape in both a portion overlapping the green tapered portion 22Gb and a portion overlapping the blue tapered portion 22Bb, in a plan view. The green tapered portion 22Gb has a backward tapered shape in a portion overlapping the red tapered portion 22Rb in a plan view and a forward tapered shape in a portion overlapping with the blue tapered portion 22Bb in a plan view. The blue tapered portion 22Bb has a backward tapered shape in both a portion overlapping the green tapered portion 22Gb and a portion overlapping the red tapered portion 22Rb in a plan view.

In this embodiment, the light-emitting element 12 is arranged to overlap the main portions 21Ra, 21Ga, and 21Ba in a plan view. The light-emitting element 12 is arranged so as not to overlap the tapered portions 21Rb, 21Gb, and 21Bb in a plan view.

On the element substrate, the tapered portions 21Rb, 21Gb, and 21Bb of the first sub-filter layer 21 are arranged to overlap the tapered portions 22Rb, 22Gb, and 22Bb of the second sub-filter layer 22 in a plan view.

In this embodiment, the thickness D1 of the first sub-filter layer 21 is substantially the same as the thickness D2 of the second sub-filter layer 22. Further, the width W1 of each tapered portion in the first sub-filter layer 21 is substantially the same as the width W2 of each tapered portion in the second sub-filter layer 22.

Referring to back FIG. 1, the light-emitting layer 15 is formed on the entire surface of the TFT array substrate 11 in a lower layer of the color filter layer 20. Further, the light-emitting layer 15 is configured as a plurality of light-emitting elements 12 partitioned by the pixel partition walls 16 having an insulation property. Therefore, the light-emitting layer 15 located at a position facing the pixel electrode 13 serves as a light-emission region and the light-emitting layer 15 located at a position facing the pixel partition wall 16 serves as a non-emission region. Accordingly, in the color filter layer 20 formed on the surface of the gas barrier layer 19, emission colors are configured to be output from only the coloring layers 20R, 20G, and 20B located at the positions facing the light-emitting element 12.

The color layers 20R, 20G, and 20B have any arrangement configuration. For example, the color layers 20R, 20G, and 20B may be formed in a stripe shape to form the color filter layer 20. Further, the color layers 20R, 20G, and 20B may be formed in a mosaic shape to form the color filter layer 20. Further, light blue, light cyan, or the like may be added depending on the purpose in addition to the basic colors of R, G, and B of the coloring layers 20R, 20G, and 20B.

The circumference sealing layer 23 is formed between the circumferences of the element substrate 10 and the protection substrate 25 to be described below.

The circumference sealing layer 23 has a function of improving of bonding position accuracy between the element substrate 10 and the protection substrate 25 and a bank function of preventing protrusion of the filling layer 24 to be described below. The circumference sealing layer 23 is formed of, for example, an epoxy material that is cured by ultraviolet rays so that viscosity is improved. An epoxy monomer/oligomer having an epoxy group and a molecular mass of 3000 or less is preferably used (definition of the monomer: molecular mass of 1000 or less, definition of oligomer: molecular mass of 1000 to 3000). Examples of the epoxy monomer/oligomer include bisphenol A-type epoxy oligomer, bisphenol F-type epoxy oligomer, phenol novolac-type epoxy oligomer, polyethylene glycol diglycidyl ether, alkyl glycidyl ether, 3,4-epoxycyclohexylmethyl-3',4'-epoxycyclohexane carboxylate, ε-caprolactone modified 3,4-epoxycylohexylmethyl, and 3',4'-epoxycyclohexane carboxylate, and one or a combination of a plurality thereof is used.

As a curing agent reacting with epoxy monomer/oligomer, a photoreactive initiator causing a cationic polymerization reaction, such as diazonium salt, diphenyliodonium salt, triphenyl sulfonium salt, sulfonic acid ester, iron arene complex, or silanol/aluminum complex is preferably used.

The filling layer 24 formed of thermoset resin is formed inside a portion surrounded by the circumference sealing layer 23 between the element substrate 10 and the protection substrate 25.

The inside of the organic EL device 1 surrounded by the above-described circumference sealing layer 23 is filled with the filling layer 24 without a gap. Therefore, the filling layer 24 fixes the protection substrate 25 disposed to face the element substrate 10 and has a function of buffering a mechanical impact from the outside to protect the light-emitting layer 15 and the gas barrier layer 19.

The filling layer 24 is necessarily formed of, as a material main component before curing, an organic compound material which has excellent fluidity and has no solvent or volatile component. An epoxy monomer/oligomer having an epoxy group and a molecular mass of 3000 or less is preferably used (definition of the monomer: molecular mass of 1000 or less, definition of oligomer: molecular mass of 1000 to 3000). Examples of the epoxy monomer/oligomer include bisphenol A-type epoxy oligomer, bisphenol F-type epoxy oligomer, phenol novolac-type epoxy oligomer, polyethylene glycol diglycidyl ether, alkyl glycidyl ether, 3,4-epoxycyclohexylmethyl-3',4'-epoxycyclohexane carboxylate, s-caprolactone modified 3,4-epoxycyclohexylmethyl, and 3',4'-epoxycyclohexane carboxylate, and one or a combination of a plurality thereof is used.

As a curing agent reacting with epoxy monomer/oligomer, an agent of forming a cured coated film having excellent electric insulation property and having excellent heat resistance thanks to strength may be used and an addition polymer type agent having excellent transparency and small curing variation may be used. For example, an acid anhydride-based curing agent such as 3-methyl-1,2,3,6-tetrahydrophthalic acid anhydride, methyl-3,6-endomethylen-1,2,3,6-tetrahydrophthalic acid anhydride, 1,2,4,5-benzenetetracarboxylic dianhydride, or 3,3'4,4'-benzenephenonetetracarboxylic dianhydride, or a polymer thereof is preferable. The curing is performed in the range of 60° C. to 100° C., and the cured coated film becomes a polymer having excellent adhesiveness with silicon oxynitride and having an ester bond. Further, when a material having a relatively large molecular mass, such as aromatic amine, alcohols, or aminophenol is added as a curing accelerant accelerating ring-opening of acid anhydride, the curing can be performed at a low temperature and in a short time.

The protection substrate 25 disposed to face the element substrate 10 is provided to protect the optical characteristics and the gas barrier layer 19. The material of the protection substrate 25 is preferably glass or transparent plastic (polyethylene terephthalate, acrylic resin, polycarbonate, polyolefin, or the like). Further, the protection substrate 25 may be provided with a functional layer such as an ultraviolet shielding/absorbing layer, a light reflection prevention layer, or a heating layer.

Method of Manufacturing Organic EL Device

Next, the method of manufacturing the organic EL device 1 according to this embodiment will be described with reference to FIGS. 3A to 6. FIGS. 3A to 6 are diagrams illustrating processes of manufacturing the organic EL device 1.

Figure 3A:
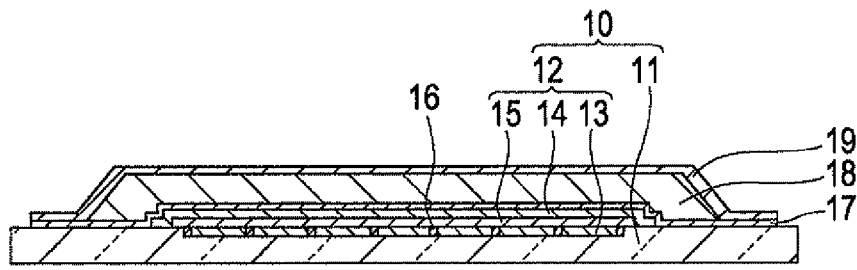
FIGS. 3A to 3E are diagrams illustrating processes of manufacturing the organic EL device.

First, as shown in FIG. 3A, the electrode protection layer 17, the organic buffer layer 18, and the gas barrier layer 19 are formed on the element substrate 10 to prepare a basis configured to form the color filter layer 20.

In a method of forming the basis, the electrode protection layer 17 is first formed to cover the entire exposed portion of the light-emitting element 12 on the element substrate 10.

Specifically, the electrode protection layer 17 is formed using a silicon compound including nitrogen, that is, silicon nitride or silicon oxynitride by a high-density plasma formation method such as an ECR sputter method or an ion plating method. Further, inorganic oxide, such as $SiO_2$, or alkali halide, such as LiF or MgF, as a transparent inorganic material may be laminated by a vacuum deposition method or a high-density plasma formation method.

Next, the organic buffer layer 18 is formed on the electrode protection layer 17.

Specifically, the organic buffer layer 18 subjected to screen printing under a reduced-pressure atmosphere is heated and cured in the range of 60° C. to 100° C.

Next, the gas barrier layer 19 is formed on the organic buffer layer 18.

Specifically, the gas barrier layer 19 is formed by a high-density plasma formation method such as an ECR sputter method or an ion plating method. When adhesiveness is improved by an oxygen plasma process before the formation of the gas barrier layer 19, reliability is improved.

Next, the color filter layer 20 is formed on the gas barrier layer 19.

Specifically, the color filter layer 20 is formed on the upper surface of the gas barrier layer 19 by a photolithographic method.

When the color filter layer is formed by the photolithographic method, a phenomenon occurs in which the material of the color filter layer spreads in a tapered shape (forward tapered shape) in an end portion of the color filter layer. Therefore, the tapered portion is formed in an end portion of the color filter layer.

Figure 14:
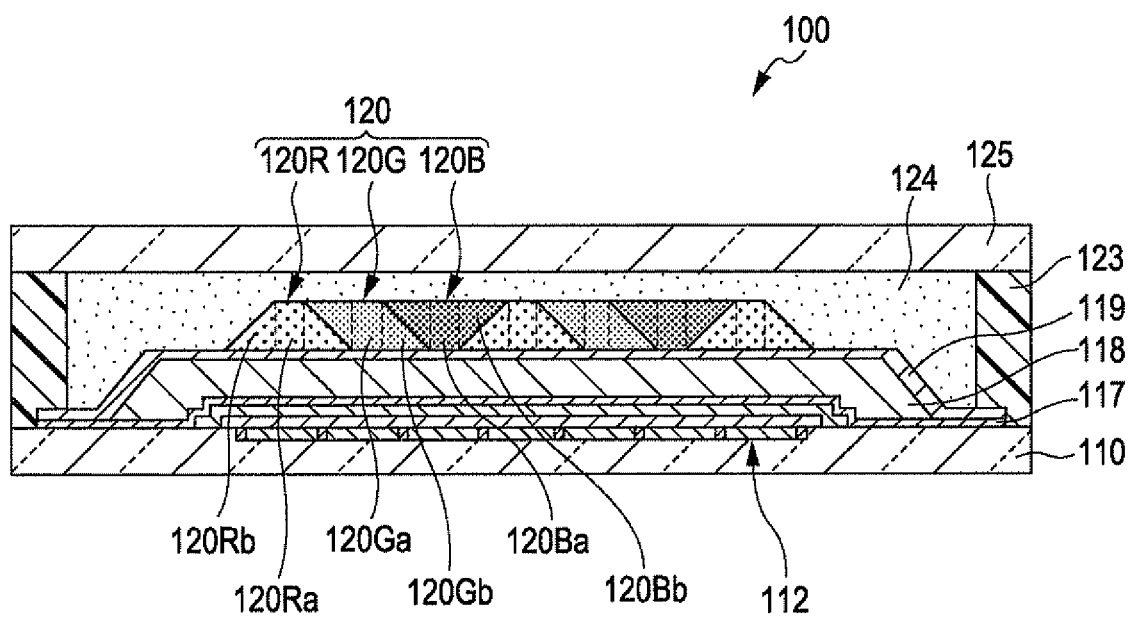
FIG. 14 is a sectional view illustrating an organic EL device according to the related art.

FIG. 14 is a sectional view illustrating an organic EL device 100 according to the related art. In FIG. 14, reference numeral 110 denotes an element substrate, reference numeral 112 denotes a light-emitting element, reference numeral 117 denotes an electrode protection layer, reference numeral 118 denotes an organic buffer layer, reference numeral 119 denotes a gas barrier layer, reference numeral 120 denotes a color filter layer, reference numeral 120R denotes a red coloring layer, reference numeral 120G denotes a green coloring layer, reference numeral 120B denotes a blue coloring layer, reference numeral 120Ra denotes a red main body, reference numeral 120Ga denotes a green main body, reference numeral 120Ba denotes a blue main body, reference numeral 120Rb denotes a red tapered portion, reference numeral 120Gb denotes a green tapered portion, reference numeral 120Bb denotes a blue tapered portion, reference numeral 123 denotes a circumference sealing layer, reference numeral 124 denotes a filling layer, and reference numeral 125 denotes a sealing substrate.

In the organic EL device 100 according to the related art, as shown in FIG. 14, the single-layered color filter layer 120 is formed on the upper surface of the gas barrier layer 119. When the color filter layer 120 is formed by a photolithographic method, the regions where the tapered portions 120Rb, 120Gb, and 120Bb are formed increase as the film thickness of the color filter layer 120 is thickened.

When high-definition of the organic EL device 100 is achieved in a portion of the color filter layer 120 in which a predetermined thickness is ensured in order to color light emitted from the light-emitting element and the value of a pixel pitch is close to the value of the film thickness of the color filter layer 120, a ratio of the formation region of the tapered portion 120Rb, 120Gb, and 120Bb per unit pixel increases. For this reason, a region (a region where the main bodies 120Ra, 120Ga, and 120Ba are formed) where the predetermined thickness is ensured in the color filter layer 120 may be very small. As a result, it is difficult to realize high color reproducibility.

Further, when the color filter layer 120 with the thick predetermined thickness is formed, the necessary temperature may be increased to burn the material (color resist) of the color filter layer 120. Therefore, the influence of the heat applied to the light-emitting layer may be increased at the burning time. On the other hand, a method (for example, burning the material at about 80° C.) of reducing the influence of the heat applied to the light-emitting layer at the burning time may be considered, but there is a concern that degassing the color filter layer 120 may not be sufficiently performed.

Accordingly, according to the invention, the color filter layer 20 is formed by laminating the first sub-filter layer 21 and the second sub-filter layer 22 by a photolithographic method.

Figure 3B:
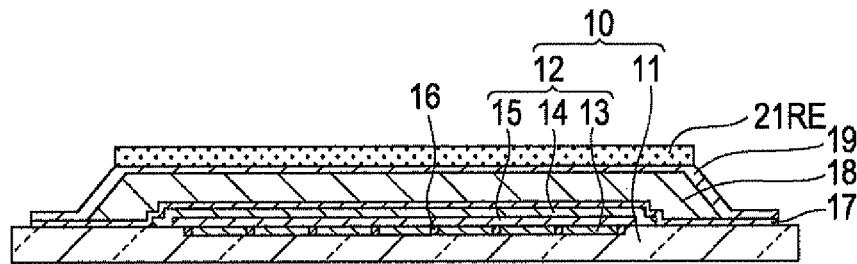
Figure 3C:
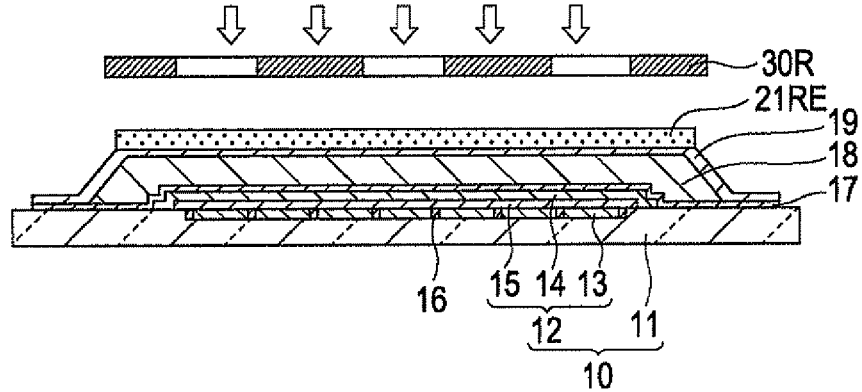

Specifically, as shown in FIG. 3B, a color resist 21RE for the red pattern is applied to the upper surface of the gas barrier layer 19.

Next, as shown in FIG. 30, a color resist 21RE is exposed via a photomask 30R for the red pattern so as to be UV-cured and insolubilzed.

Figure 3D:
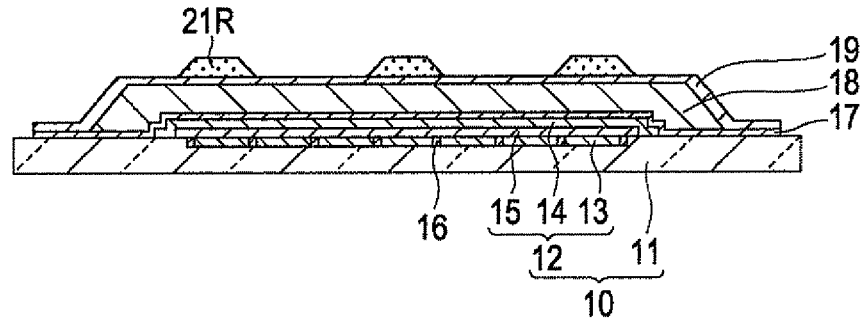
Figure 3E:
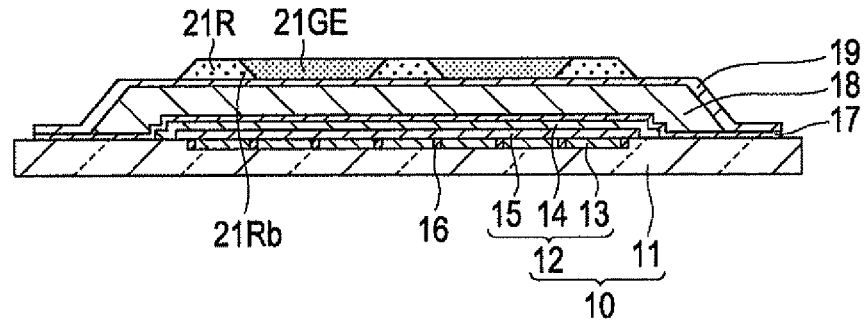

Next, as shown in FIG. 3D, an unnecessary portion of the color resist 21RE is removed by a developer, and then the remaining color resist 21RE is cured in a bake. Thus, the red patterns 21R are formed on the upper surface of the gas barrier layer 19.

Next, the green pattern 21G is formed on the upper surface of the gas barrier layer 19 so that the red tapered portion 21Rb formed in the end portion of the red pattern 21R overlaps the green tapered portion 21Gb formed in the end portion of the green pattern 21G in a plan view.

Specifically, a color resist 21GE for the green pattern is applied using the red pattern 21R as a partition wall.

Next, as shown in FIG. 4A, a color resist 21GE is exposed via a photomask 30G for the green pattern so as to be UV-cured and insolubilzed.

Next, as shown in FIG. 4B, an unnecessary portion of the color resist 21GE is removed by a developer, and then the remaining color resist 21GE is cured in the bake. Thus, the green patterns 21G are formed on the upper surface of the gas barrier layer 19. The red tapered portion 21Rb and the green tapered portion 21Gb are disposed on the gas barrier layer 19 so as to overlap one another in a plan view.

In this embodiment, the green patterns 21G are formed on the upper surface of the gas barrier layer 19 such that the red tapered portions 21Rb formed in the end portions of the red patterns 21R overlap the green tapered portions 21Gb formed in the end portions of the green patterns 21G in a plan view, but the invention is not limited thereto. For example, the green pattern 21G may be formed such that a part of the red tapered portion 21Rb overlaps the green tapered portion 21Gb in a plan view. That is, the green pattern 21G may be formed such that at least a part of the red tapered portion 21Rb overlaps the green tapered portion 21Gb in a plan view.

Next, as shown in FIG. 4C, a color resist 21BE for the blue pattern is applied using both patterns of the red pattern 21R and the green pattern 21G as partition walls.

Next, the color resist 21BE is cured in the bake. Thus, as shown in FIG. 4D, the blue pattern 21B is formed on the upper surface of the gas barrier layer 19. On the gas barrier layer 19, the green tapered portion 21Gb and the blue tapered portion 21Bb are disposed to overlap one another in a plan view and the blue tapered portion 21Bb and the red tapered portion 21Rb are disposed to overlap one another in a plan view.

In this embodiment, the green pattern 21G is formed on the upper surface of the gas barrier layer 19 such that both the red tapered portion 21Rb and the green tapered portion 21Gb overlap the blue tapered portions 21Bb, respectively, in a plan view, but the invention is not limited thereto. For example, the blue pattern 21B may be formed such that a part of the red tapered portion 21Rb and the green tapered portion 21Gb overlap the blue tapered portions 21Bb in a plan view. That is, the blue pattern 21B may be formed such that at least a part of the red tapered portion 21Rb and the green tapered portion 21Gb overlap the blue tapered portions 21Bb in a plan view.

The first sub-filter layers 21 are formed on the upper surface of the gas barrier layer 19 through the above-described processes.

Here, the coloring patterns in the first sub-filter layer 21 include three patterns, the red pattern 21R, the green pattern 21G, and the blue pattern 21B. When the red pattern 21R is used as a partition wall, the red pattern 21R formed on the outermost circumference of the gas barrier layer 19 remains. In this case, this red pattern 21R is preferably configured as a dummy pattern that does not contribute to display.

In this embodiment, the green pattern 21G is formed using the red pattern 21R as the partition wall and the blue pattern 21B is formed using both the red pattern 21R and the green pattern 21G as the partition walls, but the invention is not limited thereto. For example, the patterns 21R, 21G, and 21B may be formed at a predetermined interval by a photolithographic method. Thus, all of the patterns 21R, 21G, and 21B may be configured as patterns that contribute to display.

Referring back to FIG. 4D, a color resist 22RE for the red pattern is applied to the upper surface of the first sub-filter layer 21. When the color resist 22RE is applied, the color resist 22RE is applied such that the thickness of the color resist 22RE is substantially the same as the thickness of the above-described color resist 21RE.

Next, as shown in FIG. 4E, the color resist 22RE is exposed via the photomask 30R for the red pattern so as to be UV-cured and insolubilzed.

Figure 5A:
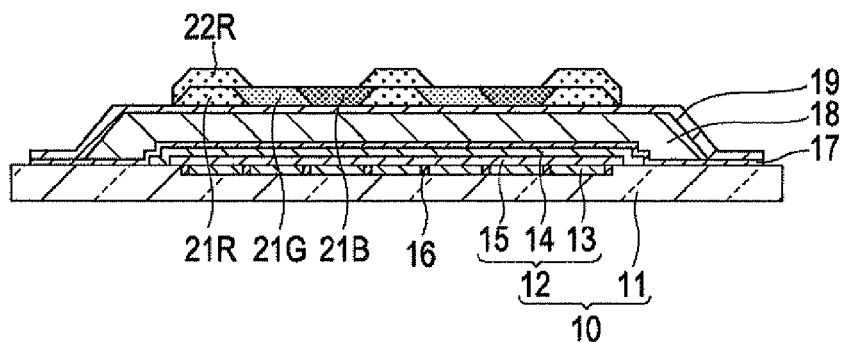
FIGS. 5A to 5E are diagrams illustrating processes subsequent to the processes shown in FIGS. 4A to 4E.
Figure 5B:
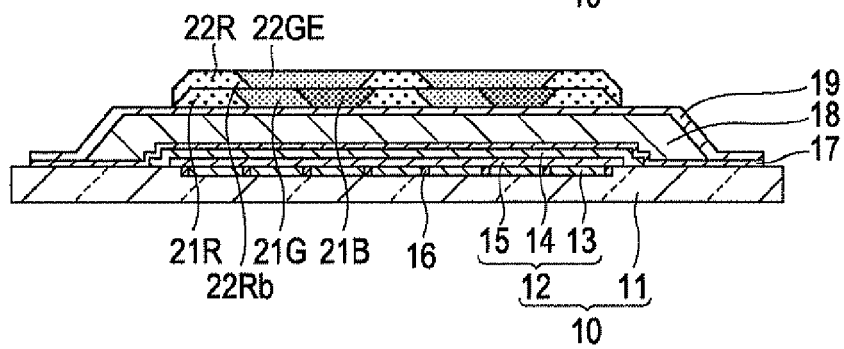

Next, as shown in FIG. 5A, an unnecessary portion of the color resist 22RE is removed by a developer, and then the remaining color resist 22RE is cured in the bake. Thus, the red patterns 22R are formed on the upper surface of the first sub-filter layer 21.

Next, the green pattern 22G is formed on the upper surface of the first sub-filter layer 21 so that the red tapered portion 22Rb formed in the end portion of the red pattern 22R overlaps the green tapered portion 22Gb formed in the end portion of the green pattern 22G in a plan view.

Specifically, a color resist 22GE for the green pattern is applied using the red pattern 22R as a partition wall. When the color resist 22GE is applied, the color resist 22GE is applied such that the thickness of the color resist 22RE is substantially the same as the thickness of the above-described color resist 21GE.

Figure 5C:
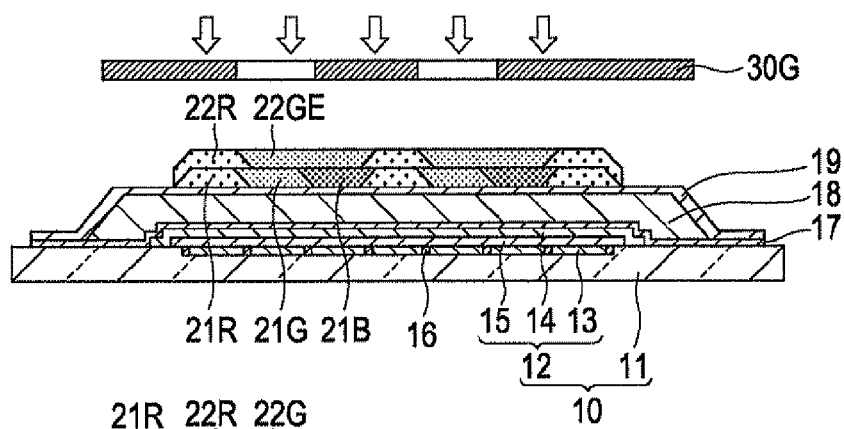
Figure 5D:
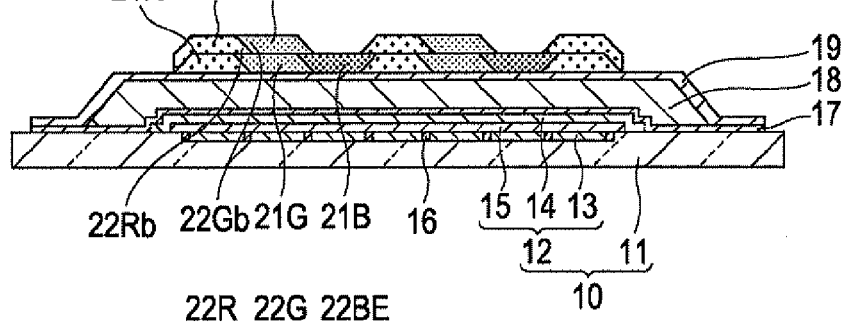

Next, as shown in FIG. 5C, a color resist 22GE is exposed via a photomask 30G for the green pattern so as to be UV-cured and insolubilzed.

Next, as shown in FIG. 5O, an unnecessary portion of the color resist 22GE is removed by a developer, and then the remaining color resist 22GE is cured in the bake. Thus, the green patterns 22G are formed on the upper surface of the first sub-filter layer 21. The red tapered portion 22Rb and the green tapered portion 22Gb are disposed on the first sub-filter layer 21 so as to overlap one another in a plan view.

Figure 5E:
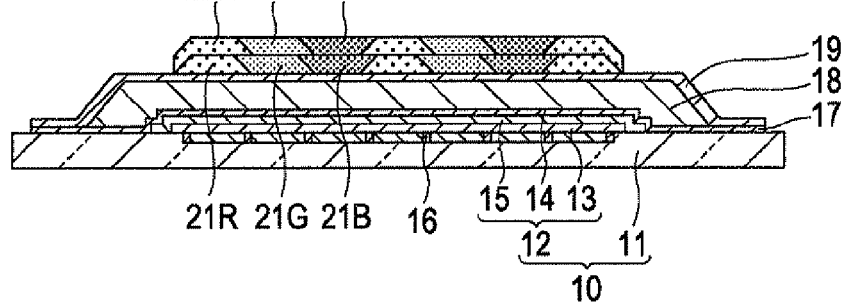

Next, as shown in FIG. 5E, a color resist 22BE for the blue pattern is applied using both patterns of the red pattern 22R and the green pattern 22G as partition walls. When the color resist 22BE is applied, the color resist 22BE is applied such that the thickness of the color resist 22BE is substantially the same as the thickness of the above-described color resist 21BE.

Next, the color resist 22BE is cured in the bake. Thus, as shown in FIG. 2, the blue pattern 22B is formed on the upper surface of the first sub-filter layer 21. On the first sub-filter layer 21, the green tapered portion 22Gb and the blue tapered portion 22Bb are disposed to overlap one another in a plan view and the blue tapered portion 22Bb and the red tapered portion 22Bb are disposed to overlap one another in a plan view.

The second sub-filter layers 22 are formed on the upper surface of the first sub-filter layer 21 through the above-described processes. Thus, the color filter layer 20 is formed on the upper surface of the gas barrier layer 19.

Here, the coloring patterns in the second sub-filter layer 22 include three patterns, the red pattern 22R, the green pattern 22G, and the blue pattern 22B. When the red pattern 22R is used as a partition wall, the red pattern 22R formed on the outermost circumference of the first sub-filter layer 21 remains. In this case, this red pattern 22R is preferably configured as a dummy pattern that does not contribute to display.

In this embodiment, the green pattern 22G is formed using the red pattern 22R as the partition wall and the blue pattern 22B is formed using both the red pattern 22R and the green pattern 22G as the partition walls, but the invention is not limited thereto. For example, after the partition walls are formed in advance on the upper surface of the gas barrier layer 19, the above-described patterns 21R, 21G, and 21B may be formed, and then the patterns 22R, 22G, and 22B may be formed on the patterns 21R, 21G, and 21B, respectively, by a photolithographic method. Thus, all of the patterns 22R, 22G, and 22B may be configured as patterns that contribute to display.

Figure 6A:
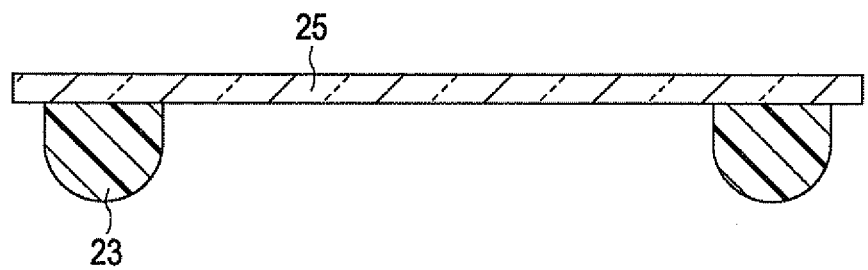
FIGS. 6A to 6C are diagrams illustrating a process subsequent to the processes shown in FIGS. 5A to 5E.

Next, as shown in FIG. 6A, the circumference sealing layer 23 is formed in the circumference of the protection substrate 25.

Specifically, the above-described ultraviolet curable resin material is applied to the circumference of the protection substrate 25 by a needle dispensing method. Further, this applying method may be a screen printing method.

Figure 6B:
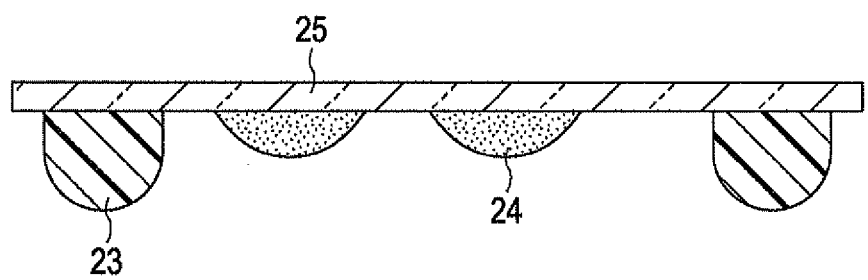

Next, as shown in FIG. 6B, the filling layer 24 is formed in the inside surrounded by the circumference sealing layer 23 of the protection substrate 25.

Specifically, the above-described thermal curable resin material is applied by a jet dispensing method. Further, the thermal curable resin material may not necessarily be applied on the entire surface of the protection substrate 25, but may be applied to a plurality of portions on the protection substrate 25.

Figure 6C:
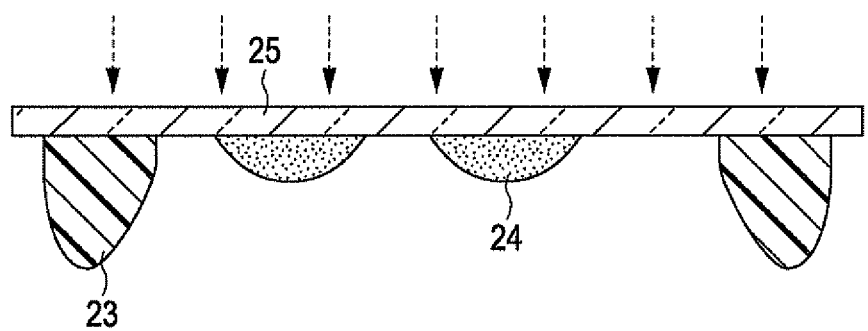

Next, as shown in FIG. 6C, ultraviolet rays are applied to the protection substrate 25 on which the material liquids of the circumference sealing layer 23 and the filling layer 24 are applied.

Specifically, an ultraviolet rays with, for example, an illumination intensity of 30 mW/cm$^2$ and a light quantity of 2000 mJ/cm$^2$ are applied to the protection substrate 25 to temporarily cure the circumference sealing layer 23. At this time, only the material liquid of the circumference sealing layer 23 which is the ultraviolet curable resin is cured and the viscosity is improved.

Next, the protection substrate 25 in which the circumference sealing layer 23 is temporarily cured is bonded to the element substrate 10 in which the color filter layer 20 is formed on the surface of the gas barrier layer 19. At this time, the circumference sealing layer 23 is disposed to completely cover a rising portion of the peripheral end portion of the organic buffer layer 18 on the element substrate 10.

Specifically, the bonding process is performed under the vacuum atmosphere in which the degree of vacuum is, for example, 1 Pa and pressure bonding is performed for 200 second at pressurization of 600 N (Newton).

Next, the compressed and bonded organic EL device 1 is heated in the atmosphere.

Specifically, by heating the element substrate 10 bonded to the protection substrate 25 in the atmosphere, the temporarily cured circumference sealing layer 23 and the filling layer 24 are thermally cured.

The organic EL device 1 (see FIG. 1) according to the above-described embodiment can be obtained through the above-described processes.

In the organic EL device 1 and the method of manufacturing the organic EL device 1 according to this embodiment, the color filter layer 20 is formed by laminating the plurality of sub-filter layers 21 and 22 by the photolithographic method. Therefore, even when it is necessary for the color filter layer 20 to have a predetermined thickness, the phenomenon in which the material of the color filter layer 20 is formed in a tapered portion in the end portions of the sub-filter layers 21 and 22 can be prevented by thinning the thickness D1 of the sub-filter layer 21 and the thickness D2 of the sub-filter layer 22. Thus, the width W1 of each of the tapered portions 21Rb, 21Gb, and 21Bb of the sub-filter layer 21 and the width W2 of each of the tapered portions 22Rb, 22Gb, and 22Bb of the sub-filter layer 22 can be made to be less than the width of the tapered portion of the color filter layer when the single-layered color filter layer is formed by the photolithographic method. Therefore, the region where the predetermined thickness can be ensured in the color filter layer 20 can be increased. Accordingly, the organic EL device 1 capable of realizing high color reproducibility can be manufactured.

When the thicknesses of the sub-filter layers are considerably different from one another, the width of the tapered portion in the sub-filter having a relatively thicker thickness is increased and the width of the tapered portion in the sub-filter having a relatively thinner thickness is decreased. Therefore, it is difficult to sufficiently obtain the region where the predetermined thickness can be ensured in the color filter layer.

According to this embodiment, however, the width W1 of each of the tapered portions 21Rb, 21Gb, and 21Bb of the sub-filter layer 21 and the width W2 of each of the tapered portions 22Rb, 22Gb, and 22Bb of the sub-filter layer 22 can be made to be substantially the same as one another by allowing the thickness D1 of the sub-filter layer 21 to be substantially the same as the thickness D2 of the sub-filter layer 22. Accordingly, the region where the predetermined thickness can be ensured in the color filter layer 20 can be obtained as much as possible.

The red tapered portion 21Rb overlaps the green tapered portion 21Gb in a plan view, the green tapered portion 21Gb overlaps the blue tapered portion 21Bb in a plan view, and the blue tapered portion 21Bb overlaps the red tapered portion 21Rb in a plan view. Accordingly, the region where the predetermined thickness can be ensured in the color filter layer 20 can be obtained in a broad range.

Further, the method of manufacturing the organic EL device 1 capable of realizing high color reproducibility can be realized in a so-called top emission type OCCF (On-chip Color Filter) structure in which the light-emitting element 12 of the element substrate 10 is sealed by a sealing layer and the color filer layer 20 is formed on the upper surface of the sealing layer.

Since the light-emitting element 12 is sealed by the sealing layers of both the electrode protection layer 17 and the gas barrier layer 19, it is possible to prevent the light-emitting element 12 from deteriorating due to the infiltration of moisture, oxygen, or the like into the light-emitting element 12 from the outside. Even when the upper surface of the electrode protection layer 17 formed on the light-emitting element 12 has an uneven shape, the region (the upper surface of the gas barrier layer 19) where the color filter layer 20 is formed can be flattened by the organic buffer layer 18. Accordingly, it is easy to form the color filter layer 20.

The color filter layer 20 has a simple configuration in that the color filter layer 20 includes two sub-filter layers 21 and 22. Therefore, it is possible to realize the organic EL device 1 capable of improving display quality.

In this embodiment, the organic EL device 1 having the top emission structure has been exemplified, but the invention is not limited thereto. The invention is also applicable to the organic EL device having a bottom emission structure. For example, in the organic EL device having the bottom emission structure, the color filter layer is formed on a side opposite to the side on which the organic EL element of the element substrate is formed.

In this embodiment, the organic EL device 1 including the circumference sealing layer 23, the filling layer 24, and the protection substrate 25 has been exemplified, but the invention is not limited thereto. The organic EL device 1 may have a configuration in which the circumference sealing layer 23, the filling layer 24, and the protection substrate 25 are not provided. In this case, it is preferable to form a protection film that covers the entire exposed portion of the color filter layer 20 formed on the gas barrier layer 19.

Second Embodiment

Figure 7:
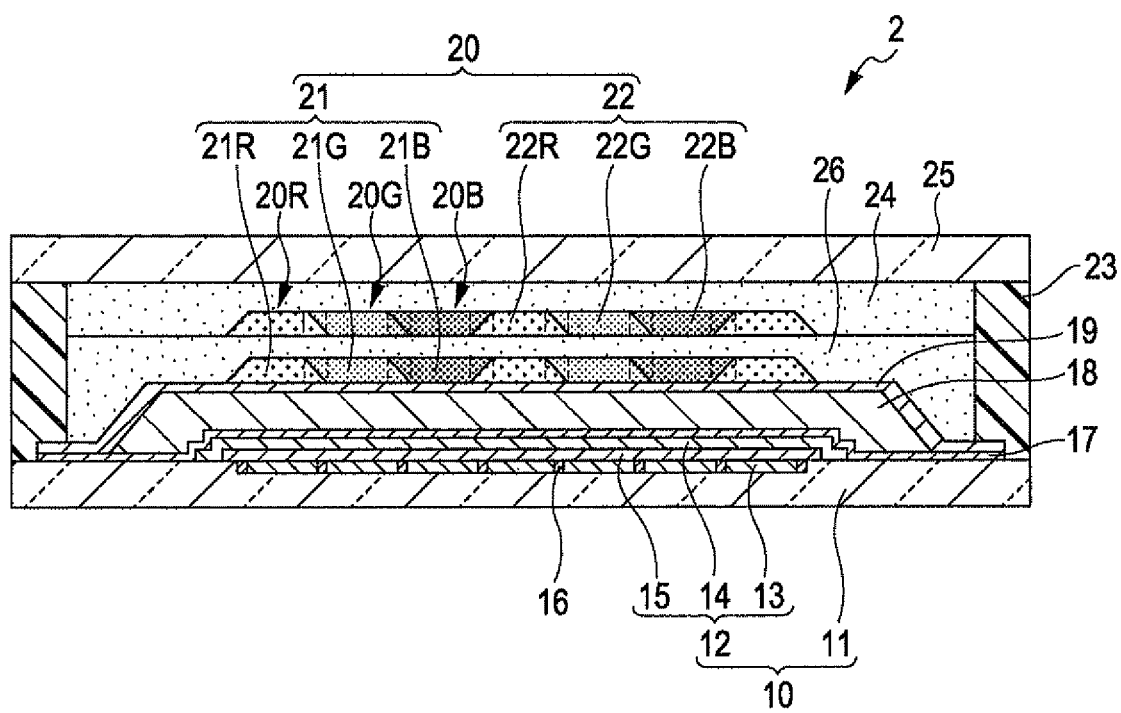
FIG. 7 is a sectional view illustrating an organic EL device according to a second embodiment of the invention.

FIG. 7 is a sectional view illustrating an organic EL device 2 according to a second embodiment of the invention. FIG. 7 corresponds to FIG. 1.

As shown in FIG. 7, the organic EL device 2 according to the second embodiment is different from the organic EL device 1 according to the above-described first embodiment in that a flattened layer 26 is formed between a first sub-filter layer 21 and a second sub-filter layer 22. The other configuration is the same as the above-described configuration. The same reference numerals are given to the same constituent elements as those in FIG. 1, and the description thereof will not be repeated.

As shown in FIG. 7, the organic EL device 2 includes an element substrate 10, an electrode protection layer 17 formed to cover the entire exposed portion of a light-emitting element 12 on the element substrate 10, an Organic buffer layer 18 formed on the electrode protection layer 17, a gas barrier layer 19 formed to cover the entire exposed portion of the organic buffer layer 18 on the electrode protection layer 17, a first sub-filter layer 21 formed on the gas barrier layer 19, a flatted layer 26 formed to the entire exposed portion of the first sub-filter layer 21 on the gas barrier layer 19, a second sub-filter layer 22 formed at a position overlapping the first sub-filter layer 21 on the flatted layer 26 in a plan view, a circumference sealing layer 23 formed along the outer circumference of the element substrate 10, a filling layer 24 formed inside the circumference sealing layer 23, and a protection substrate 25 bonded with the element substrate 10 with the circumference sealing layer 23 interposed therebetween. In this embodiment, a color filter layer 20 is formed by the first sub-filter layer 21 and the second sub-filter layer 22 with the flattened layer 26 interposed therebetween.

The flattened layer 26 is disposed to fill an uneven portion of the first sub-filter layer 21 formed in an uneven shape due to the influence of the shapes of the patterns 21R, 21G, and 21B which form the first sub-filter layer 21. The upper surface of the flattened layer 26 is formed to be substantially flat.

For example, the same material as the material of the above-described organic buffer layer 18 is used as a material of the flattened layer 26. For example, epoxy monomer/oligomer having an epoxy group and a molecular mass of 3000 or less, such as bisphenol A-type epoxy oligomer or bisphenol F-type epoxy oligomer, is used.

Figure 8A:
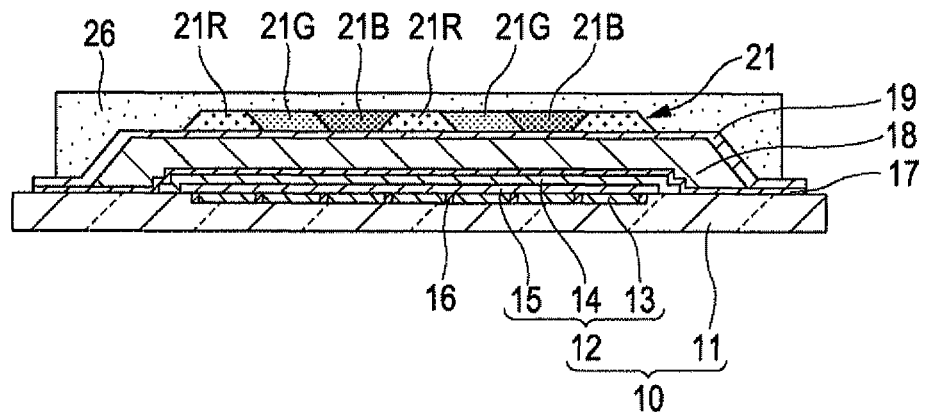
FIGS. 8A and 8B are diagrams illustrating processes of manufacturing the organic EL device.
Figure 8B:
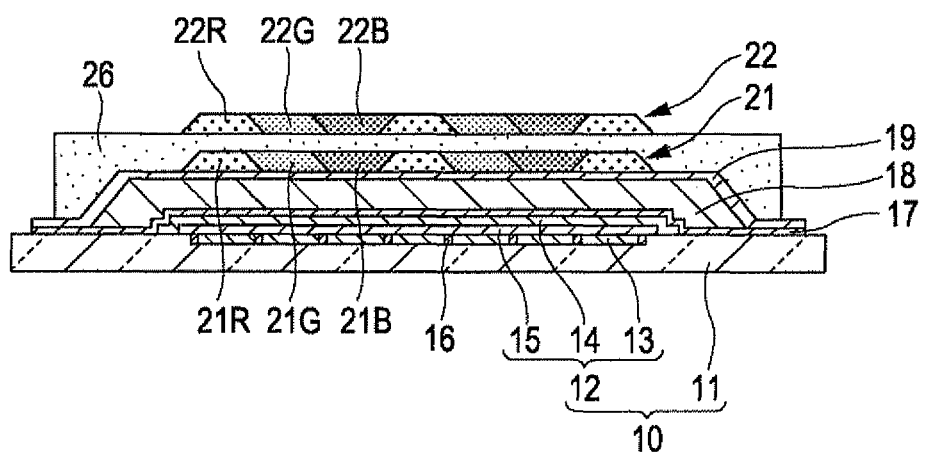

Next, a method of manufacturing the organic EL device 2 according to this embodiment will be described with reference to FIGS. 8A and 8B. FIGS. 8A and 8B are diagrams illustrating processes of manufacturing the organic EL device 2. Since the process of forming the first sub-filter layer 21 on the upper surface of the gas barrier layer 19 is the same as the process in the method of manufacturing the organic EL device 1 according to the above-described first embodiment (see FIGS. 3A to 4C), the detailed description thereof will not be repeated.

First, as shown in FIG. 8A, the flattened layer 26 is formed to cover the gas barrier layer 19 on the element substrate 10 and the entire exposed portion of the first sub-filter layer 21.

Specifically, the flattened layer 26 subjected to screen printing under a reduced-pressure atmosphere is heated and cured in the range of 60° C. to 100° C. For example, it is preferable that the flattened layer 26 remains at a low temperature until the curing is performed to some extent, and then complete curing is performed by increasing the temperature after being made to have a given high viscosity.

Next, as shown in FIG. 8B, the second sub-filter layer 22 is formed on the upper surface of the flattened layer 26. The second sub-filter layer 22 is formed such that the patterns 22R, 22G, and 22B overlap the patterns 21R, 21G, and 21B of the first sub-filter layer 21 in a plan view. Since the process of forming the second sub-filter layer 22 is the same as the process in the method of manufacturing the organic EL device 1 according to the above-described first embodiment (see FIGS. 4D to 5E), the detailed description thereof will not be repeated.

The second sub-filter layer 22 is formed on the first sub-filter layer 21 with the flattened layer 26 interposed therebetween through the above-described processes. Thus, the color filter layer 20 is formed on the gas barrier layer 19.

Then, the organic EL device 2 (see FIG. 7) according to the above-described embodiment can be manufactured by performing a process of forming the circumference sealing layer 23 in the circumference of the protection substrate 25, a process of forming the filling layer 24 in the side surrounded by the circumference sealing layer 23 of the protection substrate 25, a process of emitting ultraviolet rays to the protection substrate 25 on which material liquids of the circumference sealing layer 23 and the filling layer 24 are applied, a process of bonding the element substrate 10, in which the color filter layer 20 is formed on the gas barrier layer 19, to the protection substrate 25 in which the circumference sealing layer 23 is temporarily cured, and a process of heating the compressed and bonded organic EL device 2 in the atmosphere.

In the organic EL device 2 and the method of manufacturing the organic EL device 2 according to this embodiment, the region where the second sub-filter layer 22 is formed is flattened by the flattened layer 26, even when the upper surface of the first sub-filter 21 formed on the element substrate 10 has an uneven shape. Accordingly, it is easy to form the second sub-filter layer 22.

Third Embodiment

Figure 9:
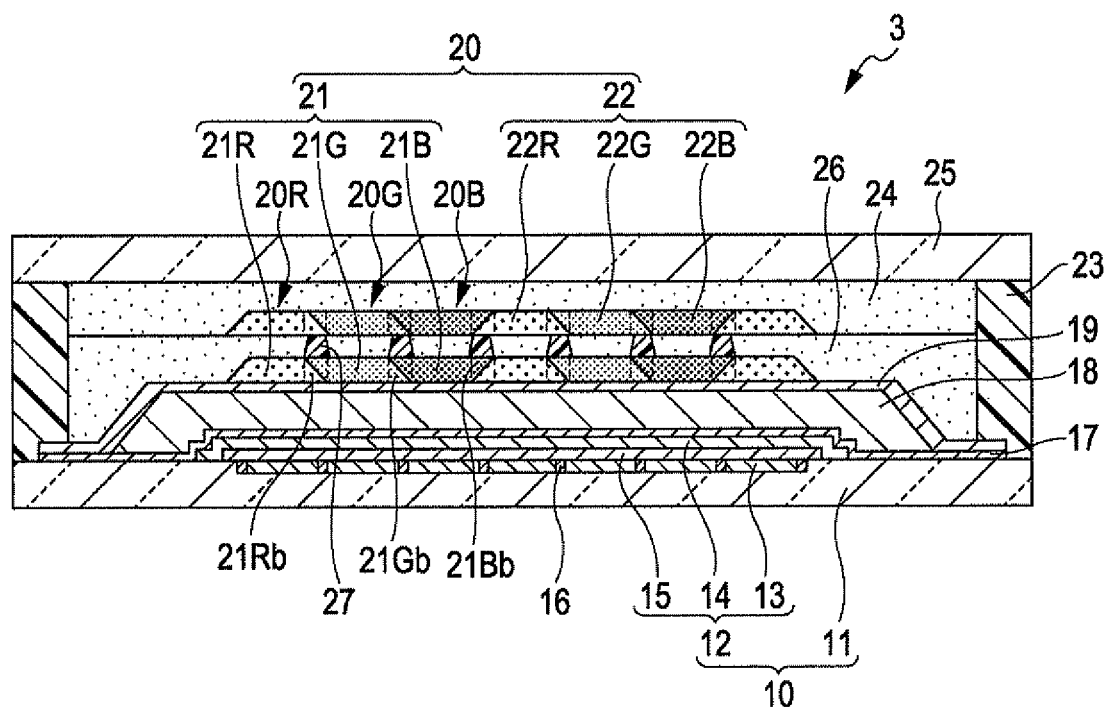
FIG. 9 is a sectional view illustrating an organic EL device according to a third embodiment of the invention.

FIG. 9 is a sectional view illustrating an organic EL device 3 according to a third embodiment of the invention. FIG. 9 corresponds to FIG. 7.

As shown in FIG. 9, the organic EL device 3 according to the third embodiment is different from the organic EL device 2 according to the above-described second embodiment in that a light-shielding layers 27 are formed on portions in which tapered portions of patterns disposed at positions adjacent to each other overlap one another. The other configuration is the same as the above-described configuration. The same reference numerals are given to the same constituent elements as those in FIG. 7, and the description thereof will not be repeated.

As shown in FIG. 9, the organic EL device 3 includes an element substrate 10, an electrode protection layer 17 formed to cover the entire exposed portion of a light-emitting element 12 on the element substrate 10, an organic buffer layer 18 formed on the electrode protection layer 17, a gas barrier layer 19 formed to cover the entire exposed portion of the organic buffer layer 18 on the electrode protection layer 17, a first sub-filter layer 21 formed on the gas barrier layer 19, the light-shielding layers 27 formed on portions in which tapered portions 21Rb, 21Gb, and 21Bb of the patterns 21R, 21G, and 21B on the first sub-filter layer 21 overlap one another, a flatted layer 26 formed to cover the entire exposed portions of the first sub-filter layer 21 and the light-shielding layers 27 on the gas barrier layer 19, a second sub-filter layer 22 formed at a position overlapping the first sub-filter layer 21 on the flatted layer 26 in a plan view, a circumference sealing layer 23 formed along the outer circumference of the element substrate 10, a filling layer 24 formed inside the circumference sealing layer 23, and a protection substrate 25 bonded with the element substrate 10 with the circumference sealing layer 23 interposed therebetween. In this embodiment, a color filter layer 20 is formed by the first sub-filter layer 21 and the second sub-filter layer 22 with the flattened layer 26 and the light-shielding layers 27 interposed therebetween.

The light-shielding layer 27 is a light-shielding layer formed of a resin in which a colorant such as carbon black is mixed. The light-shielding layer 27 prevents light leakage between adjacent pixel regions of the patterns 21R, 21G, and 215 to perform appropriate color conversion. The light-shielding layer 27 may be formed of a resin containing fluorine atoms with a liquid repellent property, and thus the entire layer may be formed of a fluorine resin. Further, the light-shielding layer 27 may be a resin layer subjected to any surface processing so that abundant fluorine atoms are present only on the surface. The width of the light-shielding layer 27 is set to be substantially the same as the width of each of the tapered portions 21Rb, 21Gb, and 21Bb. The film thickness of the light-shielding layer 27 is set to be a relatively thick film thickness in the range of about 0.5 µm to about 2 µm in consideration of a light-shielding property.

The flattened layer 26 is disposed to fill the uneven portion (the light transmission portion and the light-shielding portion of the light-shielding layer 27) of the light-shielding layer 27 formed on the first sub-filter layer 21. The upper surface of the flattened layer 26 is formed to be substantially flat.

Figure 10A:
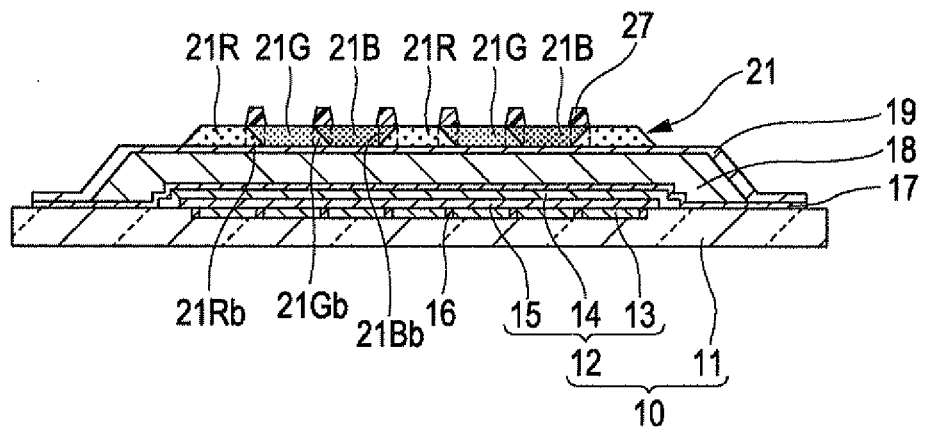
FIGS. 10A to 10C are diagrams illustrating processes of manufacturing the organic EL device.
Figure 10B:
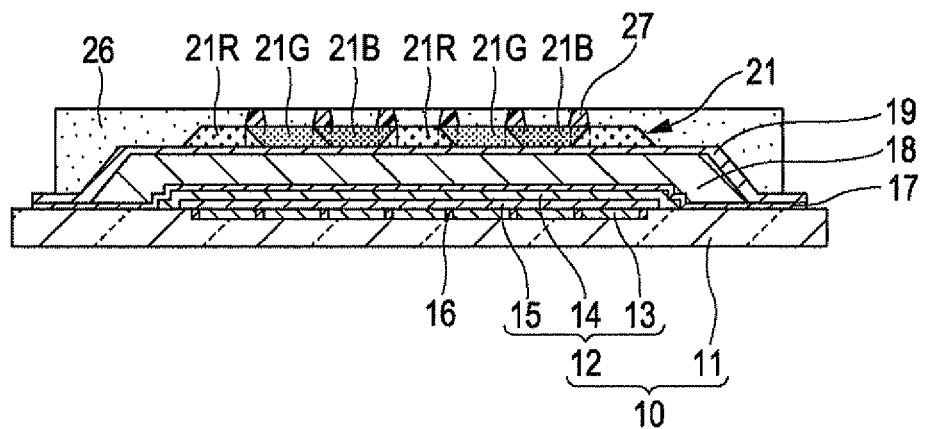
Figure 10C:
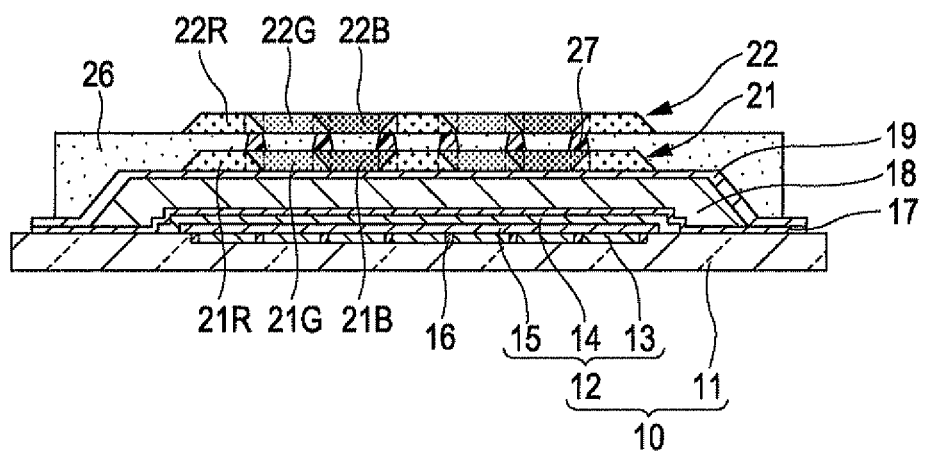

Next, a method of manufacturing the organic EL device 3 according to this embodiment will be described with reference to FIGS. 10A to 10C. FIGS. 10A to 10C are diagrams illustrating processes of manufacturing the organic EL device 3. Since the process of forming the first sub-filter layer 21 on the upper surface of the gas barrier layer 19 is the same as the process in the method of manufacturing the organic EL device 1 according to the above-described first embodiment (see FIGS. 3A to 4C), the detailed description thereof will not be repeated.

First, as shown in FIG. 10A, the light-shielding layers 27 are formed on the upper surface of the first sub-filter layer 21. The light-shielding layers 27 are formed such that the tapered portions 21Rb, 21Gb, and 21Bb of the patterns 21R, 21G, and 21B of the first sub-filter layer 21 overlap one another in the light-shield portions in a plan view.

Specifically, the material liquid of the light-shielding layer 27 is applied to the upper surface of the first sub-filter layer 21 under an air atmosphere by an ink jet method. At this time, the material liquid is applied to regions overlapping the region where the pixel partition walls 16 on the element substrate 10 are formed in a plan view. Further, partition walls may be pattern-formed of a resist or the like in advance in regions other than the regions where the light-shielding layers 27 are formed, as necessary. Next, the element substrate 10 is dried and cured in the state where only the material liquid of the light-shielding layers 27 is applied.

As the method of applying the material liquid of the light-shielding layers 27, a non-contact application method such as a jet dispensing method or a needle dispensing method may be used other than the ink jet method.

Next, as shown in FIG. 10B, the flattened layer 26 is formed to cover the gas barrier layer 19 on the element substrate 10 and the entire exposed portions of the first sub-filter layers 21 and the light-shielding layers 27.

Specifically, the flattened layer 26 subjected to screen printing under a reduced-pressure atmosphere is heated and cured in the range of 60° C. to 100° C. For example, it is preferable that the flattened layer 26 remains at a low temperature until the curing is performed to some extent, and then complete curing is performed by increasing the temperature after being made to have a given high viscosity.

Next, as shown in FIG. 10C, the second sub-filter layer 22 is formed on the upper surface of the flattened layer 26. The second sub-filter layer 22 is formed such that the patterns 22R, 22G, and 22B overlap the patterns 21R, 21G, and 21B of the first sub-filter layer 21 in a plan view.

The second sub-filter layer 22 is formed on the first sub-filter layer 21 with the flattened layer 26 and the light-shielding layers 27 interposed therebetween through the above-describe processes. Thus, the color filter layer 20 is formed on the gas barrier layer 19.

Then, the organic EL device 3 (see FIG. 9) according to the above-described embodiment can be manufactured by performing a process of forming the circumference sealing layer 23 in the circumference of the protection substrate 25, a process of forming the filling layer 24 in the side surrounded by the circumference sealing layer 23 of the protection substrate 25, a process of emitting ultraviolet rays to the protection substrate 25 on which material liquids of the circumference sealing layer 23 and the filling layer 24 are applied, a process of bonding the element substrate 10, in which the color filter layer 20 is formed on the gas barrier layer 19, to the protection substrate 25 in which the circumference sealing layer 23 is temporarily cured, and a process of heating the compressed and bonded organic EL device 3 in the atmosphere.

In the organic EL device 3 according to this embodiment, the light emitted from the light-emitting element 12 is shielded by the light-shielding layers 27. Therefore, since the light emitted from the light-emitting element 12 passes through the pattern corresponding to the light-emitting element 12, the light is prevented from passing through the neighboring patterns. Accordingly, it is possible to prevent the emission colors from mixing.

Fourth Embodiment

Figure 11:
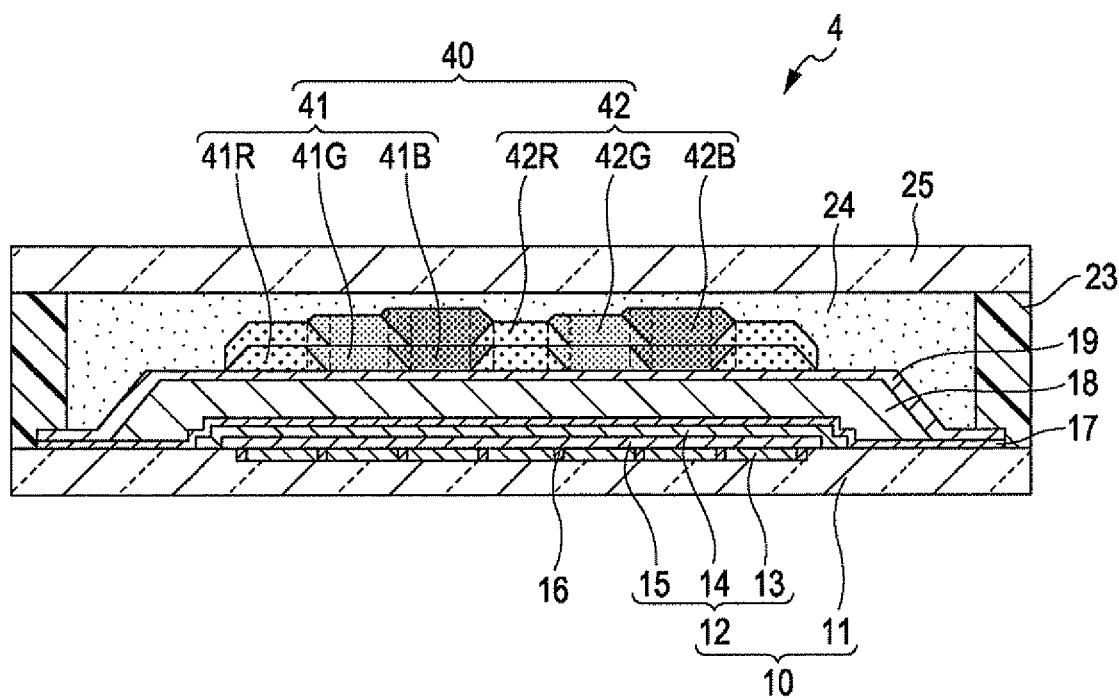
FIG. 11 is a sectional view illustrating an organic EL device according to a fourth embodiment of the invention.

FIG. 11 is a sectional view illustrating an organic EL device 4 according to a fourth embodiment of the invention. FIG. 11 corresponds to FIG. 1.

As shown in FIG. 11, the organic EL device 4 according to the fourth embodiment is different from the organic EL device 1 according to the above-described first embodiment in that a color filter layer 40 is provided instead of the color filter layer 20. The other configuration is the same as the above-described configuration. The same reference numerals are given to the same constituent elements as those in FIG. 1, and the description thereof will not be repeated.

As shown in FIG. 11, the organic EL device 4 includes an element substrate 10, an electrode protection layer 17 formed to cover the entire exposed portion of a light-emitting element 12 on the element substrate 10, an organic buffer layer 18 formed on the electrode protection layer 17, a gas barrier layer 19 formed to cover the entire exposed portion of the organic buffer layer 18 on the electrode protection layer 17, the color filter layer 40 formed on the gas barrier layer 19, a circumference sealing layer 23 formed along the outer circumference of the element substrate 10, a filling layer 24 formed inside the circumference sealing layer 23, and a protection substrate 25 bonded with the element substrate 10 with the circumference sealing layer 23 interposed therebetween.

The color filter layer 40 according to this embodiment is formed such that a first sub-filter layer 41 and a second sub-filter layer 42 in which the thickness of each pattern is adjusted are laminated.

The first sub-filter layer 41 is formed such that a red pattern 41R, a green pattern 41G, and a blue pattern 41B are adjacent to one another.

The second sub-filter layer 42 is formed such that a red pattern 42R, a green pattern 42G, and a blue pattern 42B are adjacent to one another.

In this embodiment, the first sub-filter layer 41 is formed such that the thickness of the red pattern 41R, the thickness of the green pattern 41G, and the thickness of the blue pattern 41B are substantially the same as one another. On the other hand, the second sub-filter layer 42 is formed such that the thickness of the green pattern 420 is thicker than the thickness of the red pattern 42R and the thickness of the blue pattern 42B is thicker than the thickness of the green pattern 420.

The desired color conversion characteristics of the color filter layer 40 are obtained by making the thickness of the first sub-filter layer 41 uniform overall and adjusting the thickness of each of the patterns 42R, 42G, and 42B of the second sub-filter layer 42.

In this embodiment, the first sub-filter layer 41 is formed such that the thickness of the red pattern 41R, the thickness of the green pattern 41G, and the thickness of the blue pattern 41B are substantially the same as one another, but the invention is not limited thereto. For example, the thickness of each of the patterns 41R, 41G, and 41B of the first sub-filter layer 41 may be adjusted.

In this embodiment, the second sub-filter layer 42 is formed such that the thickness of the green pattern 42G is thicker than the thickness of the red pattern 42R and the thickness of the blue pattern 42B is thicker than the thickness of the green pattern 42G, but the invention is not limited thereto. For example, the second sub-filter layer 42 may be formed such that the thickness of the green pattern 42G is thicker than the thickness of the blue pattern 42B and the thickness of the red pattern 42R is thicker than the thickness of the green pattern 42G. The thickness of each of the patterns 42R, 42G, and 42B may be adjusted appropriately, as necessary.

Next, a method of manufacturing the organic EL device 4 according to this embodiment will be described with reference to FIGS. 12A to 12E. FIGS. 12A to 12E are diagrams illustrating processes of manufacturing the organic EL device 4. Since the processes of forming the red pattern 42R of the second sub-filter layer 42 on the upper surface of the first sub-filter layer 41 are the same as the processes in the method of manufacturing the organic EL device 1 according to the above-described first embodiment (see FIGS. 3A to 5A), the detailed description thereof will not be repeated.

First, as shown in FIG. 12A, the red pattern 42R is formed on the upper surface of the first sub-filter layer 41.

Next, as shown in FIG. 12B, a color resist 42GE for the green pattern is applied so that the entire exposed portions of the red patterns 42R on the first sub-filter layer 41 is covered. Here, the color resist 42GE is formed such that the thickness of a portion formed in a region between the red patterns 42R is thicker than the thickness of the red pattern 42R.

Next, as shown in FIG. 12C, a color resist 42GE is exposed via a photomask 40G for the green pattern so as to be UV-cured and insolubilzed.

Next, as shown in FIG. 12D, an unnecessary portion of the color resist 42GE is removed by a developer, and then the remaining color resist 42GE is cured in the bake. Thus, the green patterns 42G are formed on the upper surface of the first sub-filter layer 41. The red tapered portion 42Rb and the green tapered portion 42Gb are disposed on the first sub-filter layer 41 so as to overlap one another in a plan view.

Next, as shown in FIG. 12E, a color resist 42BE for the blue pattern is applied using both patterns of the red pattern 42R and the green pattern 42G as partition walls. Here, the color resist 42GE is formed such that the thickness of a portion formed between the red pattern 42R and the green pattern 42G is thicker than the thickness of the green pattern 42G.

Next, the color resist 42BE is cured in the bake. Thus, as shown in FIG. 11, the blue pattern 42B is formed on the upper surface of the first sub-filter layer 41. On the first sub-filter layer 41, the green tapered portion 42Gb and the blue tapered portion 42Bb are disposed to overlap one another in a plan view and the blue tapered portion 42Bb and the red tapered portion 42Bb are disposed to overlap one another in a plan view.

The second sub-filter layers 42 are formed on the upper surface of the first sub-filter layer 41, in which the thickness of each pattern is adjusted, through the above-described processes. Thus, the color filter layer 40 is formed on the upper surface of the gas barrier layer 19.

Then, the organic EL device 4 (see FIG. 11) according to the above-described embodiment can be manufactured by performing a process of forming the circumference sealing layer 23 in the circumference of the protection substrate 25, a process of forming the filling layer 24 in the side surrounded by the circumference sealing layer 23 of the protection substrate 25, a process of emitting ultraviolet rays to the protection substrate 25 on which material liquids of the circumference sealing layer 23 and the filling layer 24 are applied, a process of bonding the element substrate 10, in which the color filter layer 40 is formed on the gas barrier layer 19, to the protection substrate 25 in which the circumference sealing layer 23 is temporarily cured, and a process of heating the compressed and bonded organic EL device 4 in the atmosphere.

In the method of manufacturing the organic EL device 4 according to this embodiment, it is possible to manufacture the organic EL device 4, which includes the color filter layer 40 in which the thickness of each pattern is adjusted, capable of realizing high color reproducibility.

Electronic Apparatus

Next, examples of electronic apparatuses including the organic EL device according to the above-described embodiments will be described.

Figure 13A:
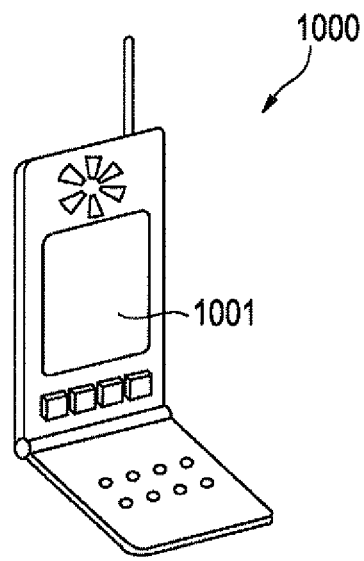
FIGS. 13A to 13C are diagrams illustrating examples of electronic apparatuses.

FIG. 13A is a perspective view illustrating an example of a portable telephone. In FIG. 13A, reference numeral 1000 denotes the body of the portable telephone and reference numeral 1001 denotes a display unit that includes the organic EL device.

Figure 13B:
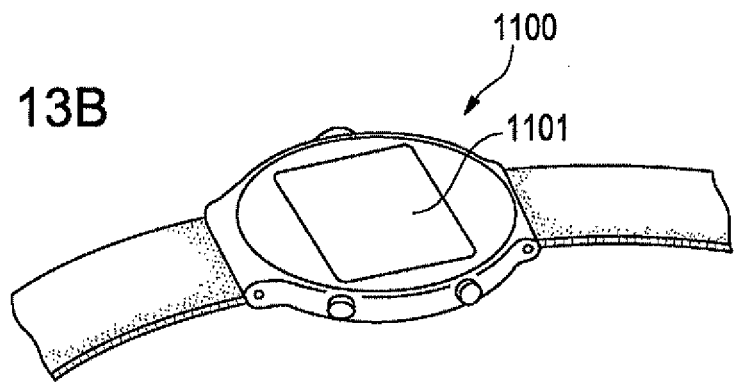

FIG. 13B is a perspective view illustrating an example of a wristwatch type electronic apparatus. In FIG. 13B, reference numeral 1100 denotes a watch body and reference numeral 1101 denotes a display unit that includes the organic EL device.

Figure 13C:
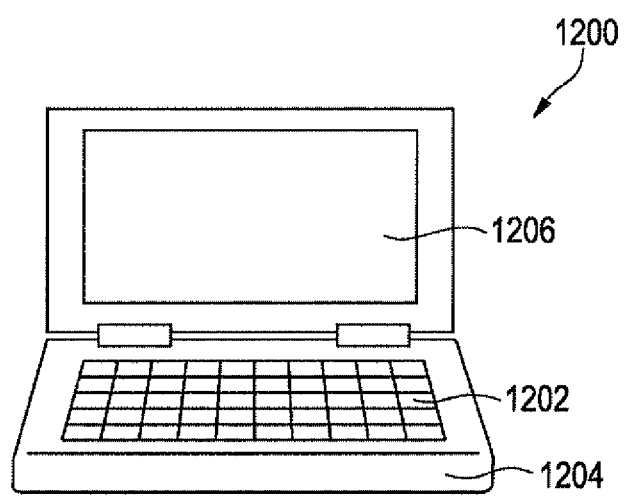

FIG. 13C is a perspective view illustrating an example of a portable information processing apparatus such as a word processor or a PC. In FIG. 13C, reference numeral 1200 denotes an information processing apparatus, reference numeral 1202 denotes an input unit such as a keyboard, reference numeral 1204 denotes an information processing body, and reference numeral 1206 denotes a display unit that includes the organic EL device.

The electronic apparatuses shown in FIGS. 13A to 13C include the organic EL device according to the above-described embodiments, and thus are apparatuses that have good display characteristics.

Examples of the electronic apparatus include an engineering workstation (EWS), a pager, a television, a viewfinder type or monitor-direct-view-type video tape recorder, an electronic pocket book, an electronic desk calculator, a car navigation apparatus, a POS terminal, a touch panel, and a head-mounted display (HMD) in addition to the above-mentioned apparatuses.

The entire disclosure of Japanese Patent Application No. 2011-160714, filed Jul. 22, 2011 is expressly incorporated by reference herein.

What is claimed is:
1. An organic EL device comprising:
a substrate;
a color filter layer that is formed above the substrate;
a first electrode that is formed between the substrate and the color filter layer;
a second electrode that is formed to face the first electrode; and an organic light-emitting layer that is formed between the first and second electrodes, wherein the color filter layer includes first and second sub-filter layers that are formed in a region overlapping the first electrode, when viewed from a direction perpendicular to the substrate, and transmit a first color, and wherein the first and second sub-filter layers are formed of the same material and the first and second sub-filter layers are laminated.

2. The organic EL device according to claim 1, further comprising:

a third electrode that is formed in the same layer of the first electrode to face the second electrode, wherein the color filter layer further includes third and fourth sub-filter layers that are formed in a region overlapping the third electrode, when viewed from the direction perpendicular to the substrate, and transmit a second color, wherein the third and fourth sub-filter layers are formed of the same material, wherein the third and fourth sub-filter layers are laminated, wherein an end of the first sub-filter layer and an end of the third sub-filter layer overlap one another, when viewed from the direction perpendicular to the substrate, and wherein an end of the second sub-filter layer and an end of the fourth sub-filter layer overlap one another, when viewed from the direction perpendicular to the substrate.

3. The organic EL device according to claim 1, further comprising:

a flattened layer that is formed between the first and second sub-filter layers.

4. The organic EL device according to claim 2, further comprising:

a flattened layer that is formed between the first and second sub-filter layers, wherein a light-shielding layer is formed in a region of the flattened layer overlapping the first and third sub-filter layers, when viewed from the direction perpendicular to the substrate.

5. The organic EL device according to claim 1, further comprising:

a sealing layer that is formed between the second electrode and the color filter layer, wherein the color filter layer is adjacent to the sealing layer.

6. A method of manufacturing an organic EL device, comprising:

forming a first electrode on a substrate;

forming an organic light-emitting layer on the first electrode;

forming a second electrode on the organic light-emitting layer; and forming a color filter layer on the second electrode in a region overlapping the first electrode, when viewed from a direction perpendicular to the substrate, wherein the forming of the color filter layer includes forming a first sub-filter layer by a photolithographic method, and forming a second sub-filter layer on the first sub-filter layer using the same material of the first sub-filter layer by the photolithographic method.

7. An electronic apparatus comprising:
the organic EL device according to claim 1.
8. An electronic apparatus comprising:
the organic EL device according to claim 2.
9. An electronic apparatus comprising:
the organic EL device according to claim 3.
10. An electronic apparatus comprising:
the organic EL device according to claim 4.
11. An electronic apparatus comprising:
the organic EL device according to claim 5.

* * * * *